(12) United States Patent
Fujii

(10) Patent No.: US 12,451,440 B2
(45) Date of Patent: Oct. 21, 2025

(54) ELECTRONIC DEVICE AND MANUFACTURING METHOD THEREOF

(71) Applicant: FUJIFILM Corporation, Tokyo (JP)

(72) Inventor: Yusuke Fujii, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 184 days.

(21) Appl. No.: 18/402,676

(22) Filed: Jan. 2, 2024

(65) Prior Publication Data

US 2024/0186261 A1 Jun. 6, 2024

Related U.S. Application Data

(63) Continuation of application No. PCT/JP2022/024611, filed on Jun. 20, 2022.

(30) Foreign Application Priority Data

Jul. 29, 2021 (JP) ................. 2021-124424

(51) Int. Cl.
  *H05K 1/18* (2006.01)
  *H01L 21/56* (2006.01)
  (Continued)

(52) U.S. Cl.
  CPC ............ *H01L 23/552* (2013.01); *H01L 21/56* (2013.01); *H05K 1/0218* (2013.01); *H05K 1/185* (2013.01);
  (Continued)

(58) Field of Classification Search
  CPC ......... H05K 1/0218; H05K 1/185; H05K 3/22
  (Continued)

(56) References Cited

U.S. PATENT DOCUMENTS 5,436,203 A * 7/1995 Lin .................. H01L 23/24
  29/841
2004/0114335 A1 6/2004 Sugimoto et al.
(Continued)

FOREIGN PATENT DOCUMENTS

JP H10214923 8/1998
JP 2002164479 6/2002
(Continued)

OTHER PUBLICATIONS

"International Search Report (Form PCT/ISA/210) of PCT/JP2022/024611", mailed on Sep. 13, 2022, with English translation thereof, pp. 1-6.

(Continued)

*Primary Examiner* — Binh B Tran
(74) *Attorney, Agent, or Firm* — JCIPRNET

(57) ABSTRACT

Provided are an electronic device including: a wiring board having a mounting surface; a plurality of electronic components mounted on the mounting surface; a ground electrode that surrounds at least one electronic component among the plurality of electronic components; an insulating protective layer that covers the at least one electronic component; an electromagnetic wave shielding layer that covers the insulating protective layer and is electrically connected to the ground electrode, the electromagnetic wave shielding layer being a solidified product of an ink for forming an electromagnetic wave shielding layer; and an insulating partition wall that is provided along an outer edge of the ground electrode, and a manufacturing method thereof.

9 Claims, 4 Drawing Sheets

(51) Int. Cl.
    *H01L 23/552*      (2006.01)
    *H05K 1/02*      (2006.01)
    *H05K 3/22*      (2006.01)
    *H01L 25/065*      (2023.01)
    *H01L 25/16*      (2023.01)

(52) U.S. Cl.
    CPC ............ *H05K 3/22* (2013.01); *H01L 25/0655* (2013.01); *H01L 25/16* (2013.01); *H05K 2201/10015* (2013.01); *H05K 2201/10166* (2013.01); *H05K 2203/1366* (2013.01); *H05K 2203/1469* (2013.01)

(58) Field of Classification Search
    USPC ........................................................ 361/748
    See application file for complete search history.

(56) References Cited

U.S. PATENT DOCUMENTS

2015/0016066 A1    1/2015    Shimamura et al.
2017/0236786 A1    8/2017    Suzuki
2020/0303320 A1    9/2020    Kong et al.
2020/0367393 A1*   11/2020    Mun ................. H01L 23/49838

FOREIGN PATENT DOCUMENTS

| JP | 2004186219 | 7/2004 |
| JP | 2009062523 | 3/2009 |
| JP | 2015035579 | 2/2015 |
| JP | 2017147341 | 8/2017 |
| JP | 2019091866 | 6/2019 |

OTHER PUBLICATIONS

"Written Opinion of the International Searching Authority (Form PCT/ISA/237) of PCT/JP2022/024611", mailed on Sep. 13, 2022, with English translation thereof, pp. 1-8.

* cited by examiner

ELECTRONIC DEVICE AND MANUFACTURING METHOD THEREOF

CROSS-REFERENCE TO RELATED APPLICATION

This application Continuation of International Application No. PCT/JP2022/024611, filed Jun. 20, 2022, which claims priority to Japanese Patent Application No. 2021-124424 filed Jul. 29, 2021. Each of the above applications is hereby expressly incorporated by reference, in its entirety, into the present application.

BACKGROUND OF THE INVENTION

1. Field of the Invention

The present disclosure relates to an electronic device and a manufacturing method thereof.

2. Description of the Related Art

In the related art, studies have been conducted on an electronic device (sometimes referred to as an "electronic element", a "print substrate", a "circuit module", or the like) having a structure in which an electronic component is mounted on a wiring board.

For example, JP2019-91866A discloses the following manufacturing method, as a method of manufacturing an electronic element that has a sufficient electromagnetic wave shielding effect, can easily remove heat generation from an electronic component, and can be made thinner.

The manufacturing method for an electronic element disclosed in JP2019-91866A is a manufacturing method of an electronic element including an electronic substrate including a wiring board having a mounting surface, and a plurality of electronic components mounted on the mounting surface of the wiring board, an insulating protective layer that is provided on the electronic substrate and includes the electronic components, an electromagnetic wave shielding layer that is provided on the insulating protective layer and includes the electronic components, and a ground section that grounds the electromagnetic wave shielding layer by contacting the electromagnetic wave shielding layer, the method comprising: a first step of forming the insulating protective layer from an insulating material; and a second step of forming the electromagnetic wave shielding layer on the insulating protective layer from a conductive material.

In addition, JP2004-186219A discloses the following print substrate as a practical print substrate having a sufficient noise reducing effect.

The print substrate disclosed in JP2004-186219A is a single-sided print substrate having a substrate surface on which components are mounted and a wiring pattern formed for wiring between the components, the print substrate comprising: a power supply circuit for supplying a power supply of a predetermined voltage; and a high frequency circuit having a high frequency signal source, as a circuit operated by the power supply, in which, on the substrate surface, a conductive film having a hole pattern surrounding the mounting components and an electric insulating film are formed in a formation region of the high frequency circuit such that the conductive film serves as an upper layer, and the conductive film is electrically connected to a ground pattern of the wiring pattern in a non-formation portion of the electric insulating film.

In addition, JP2015-35579A discloses the following circuit module as a circuit module capable of suppressing an electrical influence between an electromagnetic shield and an electronic component.

The circuit module disclosed in JP2015-35579A is a circuit module including: a wiring board having a mounting surface; an electronic component mounted on the mounting surface; a sealing layer that is formed of an insulating material, covers the electronic component, and has a first surface and a second surface, the first surface being opposite to the mounting surface and having a first sealing region and a second sealing region protruding from the first sealing region to an opposite side of the mounting surface, the second surface being connected to the mounting surface and the first surface; and a conductive shield that covers the first surface and the second surface of the sealing layer and has a first shield portion that covers the first surface and has a first shield region and a second shield region, the first shield region being formed on the first sealing region and having a predetermined thickness and the second shield region being formed on the second sealing region and having the predetermined thickness, and a second shield portion that covers the second surface and is connected to the mounting surface.

In addition, JP2017-147341A discloses the following semiconductor package as a semiconductor package capable of blocking electromagnetic noise that adversely affects a wireless system without employing a sheet metal shield.

The semiconductor package disclosed in JP2017-147341A is a semiconductor package including: a substrate having a first surface, a second surface, and a wiring pattern inside; a semiconductor element mounted on the first surface of the substrate; a sealing resin that seals the semiconductor element; a plurality of external connection electrodes formed on the second surface of the substrate; an electromagnetic wave shielding film that is formed on an upper surface of the sealing resin and side surfaces of the sealing resin and the substrate and shields electromagnetic waves; and a ground wiring that is electrically connected to the electromagnetic wave shielding film and formed on the substrate.

SUMMARY OF THE INVENTION

The present inventor has studied manufacturing an electronic device by forming, on an electronic substrate comprising a wiring board having a mounting surface, a plurality of electronic components mounted on the mounting surface of the wiring board, and a ground electrode disposed to surround at least one electronic component among the plurality of electronic components in plan view, an insulating protective layer that is disposed in a ground region surrounded by the ground electrode and covers the at least one electronic component and an electromagnetic wave shielding layer that extends over the insulating protective layer and the ground electrode and that covers the insulating protective layer and is electrically connected to the ground electrode. Further, from the viewpoint of simplification of a manufacturing process and a manufacturing apparatus, the present inventor has studied forming the electromagnetic wave shielding layer by a liquid process using an ink for forming an electromagnetic wave shielding layer instead of a vapor phase process (for example, sputtering, vapor deposition, or chemical vapor deposition).

However, as a result of these studies, it was found that, in a case in which the electromagnetic wave shielding layer is formed by the liquid process, the ink for forming an electromagnetic wave shielding layer flows out to an outside of the ground region, and as a result, a defect (for example, a short circuit occurring between the formed electromagnetic wave shielding layer and a conductive component disposed outside the ground region) caused by the outflow of the ink for forming an electromagnetic wave shielding layer may occur.

According to one aspect of the present disclosure, there are provided an electronic device in which a defect caused by an outflow of an ink for forming an electromagnetic wave shielding layer is suppressed, and a manufacturing method thereof.

The specific methods for achieving the above-described object include the following aspects.

<1> An electronic device comprising: a wiring board having a mounting surface; a plurality of electronic components mounted on the mounting surface of the wiring board; a ground electrode disposed to surround at least one electronic component among the plurality of electronic components in plan view; an insulating protective layer that is disposed in a ground region surrounded by the ground electrode and covers the at least one electronic component; an electromagnetic wave shielding layer that is provided to extend over the insulating protective layer and the ground electrode and that covers the insulating protective layer and is electrically connected to the ground electrode, the electromagnetic wave shielding layer being a solidified product of an ink for forming an electromagnetic wave shielding layer; and an insulating partition wall that is provided along an outer edge of the ground electrode.

<2> The electronic device according to <1>, in which a height of the insulating partition wall is lower than a height of the insulating protective layer on the at least one electronic component.

<3> The electronic device according to <1> or <2>, in which a height of the insulating partition wall is lower than a height of the insulating protective layer on the at least one electronic component by 5 µm or more.

<4> The electronic device according to any one of <1> to <3>, in which a height of the insulating partition wall is higher than a height of the ground electrode.

<5> The electronic device according to any one of <1> to <4>, in which a height of the insulating partition wall is higher than a height of the ground electrode by 5 µm or more.

<6> The electronic device according to any one of <1> to <5>, in which the insulating partition wall has an aspect ratio of 0.01 to 10, which is a ratio of a height to a thickness.

<7> A manufacturing method of an electronic device, the method comprising: a preparation step of preparing an electronic substrate including a wiring board having a mounting surface, a plurality of electronic components mounted on the mounting surface of the wiring board, and a ground electrode disposed to surround at least one electronic component among the plurality of electronic components in plan view; a first step of forming an insulating protective layer that covers the at least one electronic component in a ground region surrounded by the ground electrode; and a second step of forming an electromagnetic wave shielding layer that extends over the insulating protective layer and the ground electrode and that covers the insulating protective layer and is electrically connected to the ground electrode, as a solidified product of an ink for forming an electromagnetic wave shielding layer, in which an insulating partition wall is formed along an outer edge of the ground electrode before the second step.

<8> The manufacturing method of an electronic device according to <7>, in which, in the first step, the insulating protective layer and the insulating partition wall are formed by using an ink for forming an insulating protective layer.

<9> The manufacturing method of an electronic device according to <8>, in which, in the first step, the ink for forming an insulating protective layer is applied by an ink jet recording method, a dispenser method, or a spray method to form the insulating protective layer and the insulating partition wall.

<10> The manufacturing method of an electronic device according to <8> or <9>, in which the ink for forming an insulating protective layer is an active energy ray curable-type ink.

According to one aspect of the present disclosure, there are provided an electronic device in which a defect caused by an outflow of an ink for forming an electromagnetic wave shielding layer is suppressed, and a manufacturing method thereof.

DESCRIPTION OF THE PREFERRED EMBODIMENTS

Figure 1A:
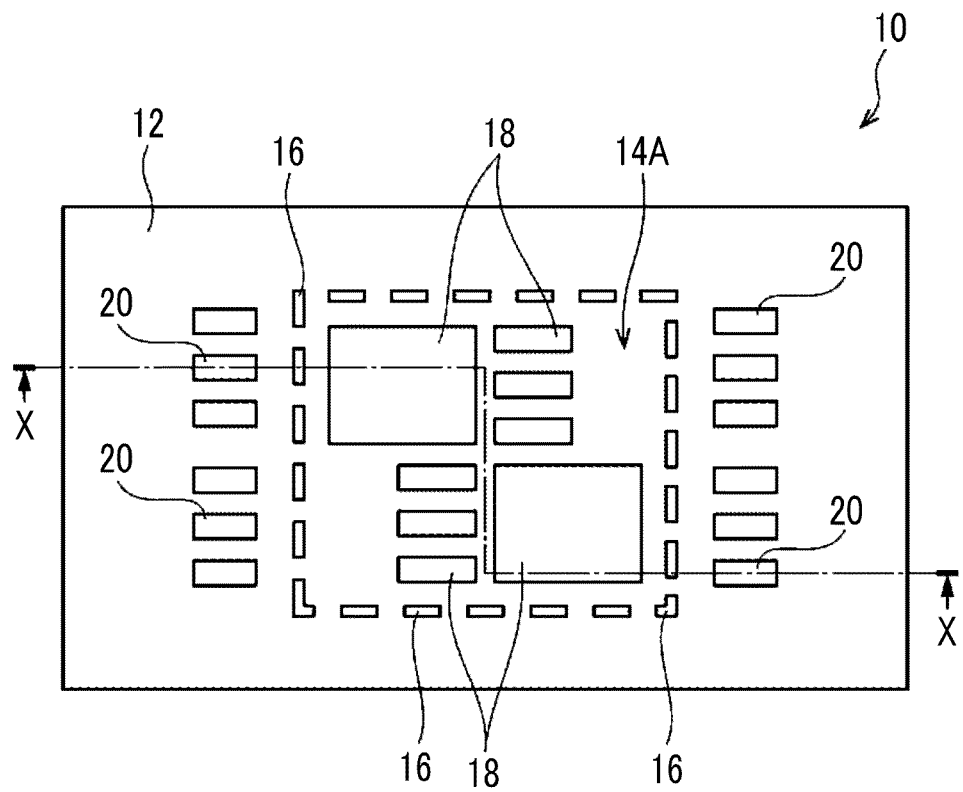
FIG. 1A is a schematic plan view of an electronic substrate prepared in a preparation step in a manufacturing method according to an embodiment of the present disclosure.

In the present disclosure, a numerical range shown using "to" indicates a range including the numerical values described before and after "to" as a lower limit and an upper limit.

In the present disclosure, in a case in which a plurality of substances corresponding to respective components in a composition are present, the amount of the respective components in the composition indicates the total amount of the plurality of substances present in the composition unless otherwise specified.

In a numerical range described in a stepwise manner in the present disclosure, an upper limit or a lower limit described in a certain numerical range may be replaced with an upper limit or a lower limit in another numerical range described in a stepwise manner or a value described in an example.

In the present disclosure, the term "step" denotes not only an individual step but also a step which is not clearly distinguishable from another step as long as an effect expected from the step can be achieved.

In the present disclosure, a combination of preferred aspects is a more preferred embodiment.

[Electronic Device]

An electronic device of the present disclosure comprises: a wiring board having a mounting surface; a plurality of electronic components mounted on the mounting surface of the wiring board; a ground electrode disposed to surround at least one electronic component among the plurality of electronic components in plan view; an insulating protective layer that is disposed in a ground region surrounded by the ground electrode and covers the at least one electronic component; an electromagnetic wave shielding layer that is provided to extend over the insulating protective layer and the ground electrode and that covers the insulating protective layer and is electrically connected to the ground electrode, the electromagnetic wave shielding layer being a solidified product of an ink for forming an electromagnetic wave shielding layer; and an insulating partition wall that is provided along an outer edge of the ground electrode.

According to the electronic device of the present disclosure, a defect caused by an outflow of the ink for forming an electromagnetic wave shielding layer is suppressed.

Hereinafter, such an effect will be described in more detail.

As described above, the present inventor has studied manufacturing an electronic device by forming, on an electronic substrate comprising the wiring board, the plurality of electronic components, and the ground (GND) electrode, the insulating protective layer that is disposed in the ground region surrounded by the ground electrode and covers the at least one electronic component and the electromagnetic wave shielding layer that extends over the insulating protective layer and the ground electrode and that covers the insulating protective layer and is electrically connected to the ground electrode.

Further, from the viewpoint of simplification of a manufacturing process and a manufacturing apparatus, the present inventor has studied forming the electromagnetic wave shielding layer by a liquid process using an ink for forming an electromagnetic wave shielding layer instead of a vapor phase process (for example, sputtering, vapor deposition, or chemical vapor deposition).

However, as a result of these studies, it was found that, in a case in which the electromagnetic wave shielding layer is formed by the liquid process, the ink for forming an electromagnetic wave shielding layer flows out to an outside of the ground region, and as a result, a defect (for example, a short-circuit occurring between the formed electromagnetic wave shielding layer and a conductive component disposed outside the ground region) caused by the outflow of the ink for forming an electromagnetic wave shielding layer may occur.

With respect to the above-described problem, the electronic device of the present disclosure is provided with the insulating partition wall along the outer edge of the ground electrode (that is, an outer edge of the ground electrode as viewed from an inside of the ground region).

Thereby, even in a case in which the ink for forming an electromagnetic wave shielding layer is about to flow out of the ground region, the ink for forming an electromagnetic wave shielding layer is dammed by the insulating partition wall, and the outflow of the ink for forming an electromagnetic wave shielding layer is suppressed.

As a result, a defect (for example, the short-circuit described above) caused by the outflow of the ink for forming an electromagnetic wave shielding layer is suppressed.

In the present disclosure, the term "conductive" means properties of having a volume resistivity of less than $10^8$ Ωcm.

In the present disclosure, the insulating properties mean properties of having a volume resistivity of $10^{10}$ Ωcm or more.

<Embodiment of Manufacturing Method of Electronic Device>

Hereinafter, an embodiment of a manufacturing method of an electronic device of the present disclosure will be shown.

A manufacturing method of an electronic device according to the embodiment of the present disclosure includes: a preparation step of preparing an electronic substrate including a wiring board having a mounting surface, a plurality of electronic components mounted on the mounting surface of the wiring board, and a ground electrode disposed to surround at least one electronic component among the plurality of electronic components in plan view; a first step of forming an insulating protective layer that covers the at least one electronic component in a ground region surrounded by the ground electrode; and a second step of forming an electromagnetic wave shielding layer that extends over the insulating protective layer and the ground electrode and that covers the insulating protective layer and is electrically connected to the ground electrode, as a solidified product of an ink for forming an electromagnetic wave shielding layer, in which an insulating partition wall is formed along an outer edge of the ground electrode before the second step.

The manufacturing method of an electronic device according to the embodiment of the present disclosure may include other steps as necessary.

In the manufacturing method of an electronic device according to the embodiment of the present disclosure, before the second step of forming the electromagnetic wave shielding layer by using the ink for forming an electromagnetic wave shielding layer, the insulating partition wall is formed along the outer edge of the ground electrode (that is, an outer edge of the ground electrode as viewed from an inside of the ground region).

Therefore, even in a case in which the ink for forming an electromagnetic wave shielding layer is about to flow out of the ground region, the ink for forming an electromagnetic wave shielding layer that is about to flow out is dammed by the insulating partition wall, and the outflow of the ink for forming an electromagnetic wave shielding layer to the outside of the ground region is suppressed.

As a result, a defect (for example, the short-circuit described above) caused by the outflow of the ink for forming an electromagnetic wave shielding layer is suppressed.

Hereinafter, an example of the manufacturing method of an electronic device according to an embodiment of the present disclosure will be described with reference to the drawings. Note that the manufacturing method of an electronic device according to the embodiment of the present disclosure is not limited to the following example.

In the following description, substantially the same elements (for example, components or parts) may be designated by the same reference numerals, and redundant description thereof may be omitted.

Figure 1B:
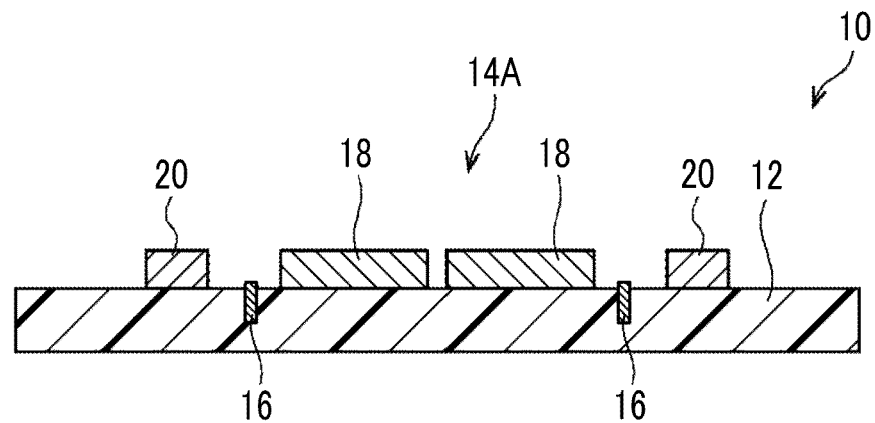
FIG. 1B is a cross-sectional view taken along the line X-X of FIG. 1A.

FIG. 1A is a schematic plan view of the electronic substrate prepared in the preparation step, and FIG. 1B is a cross-sectional view taken along the line X-X of FIG. 1A.

Figure 2A:
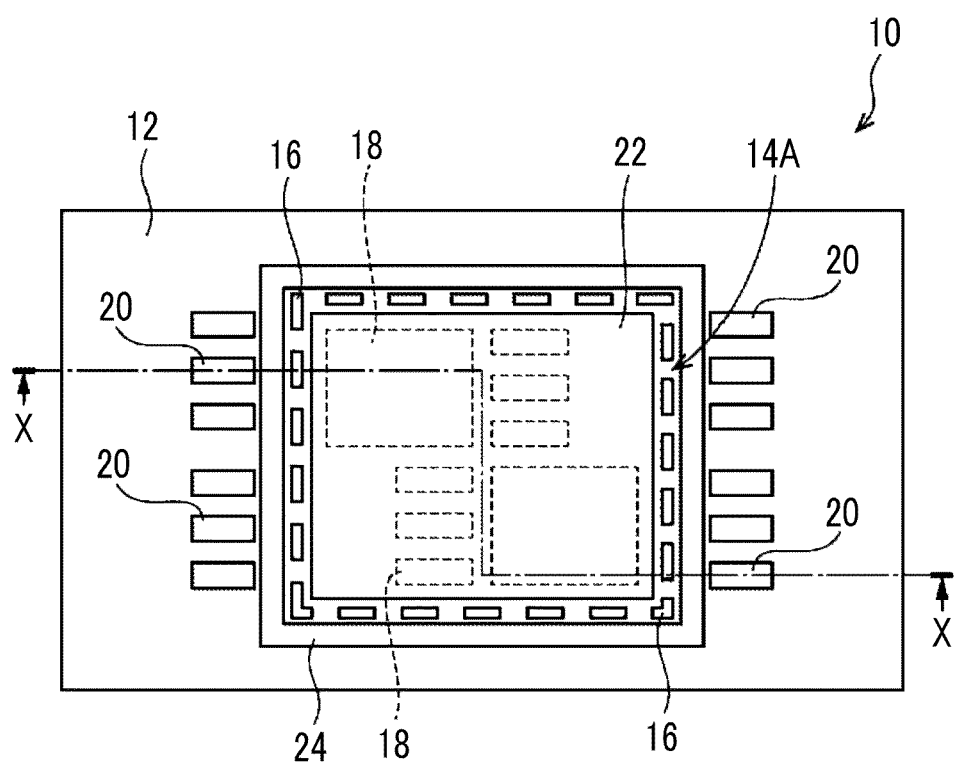
FIG. 2A is a schematic plan view of an electronic substrate on which an insulating protective layer is formed in a first step in the manufacturing method according to the embodiment of the present disclosure.
Figure 2B:
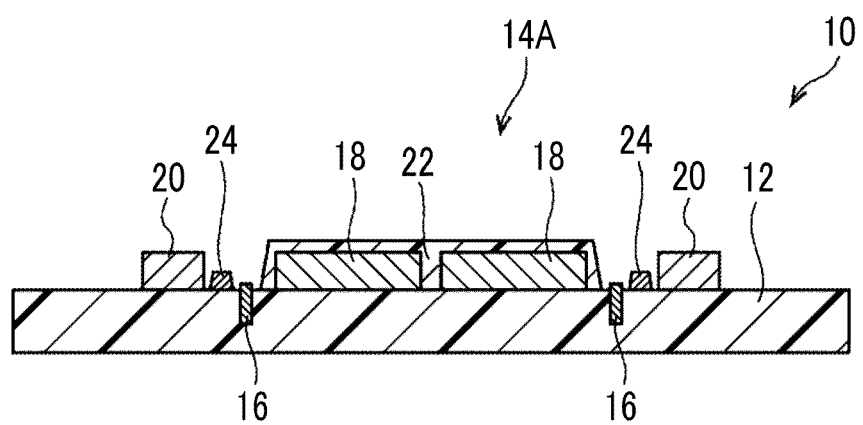
FIG. 2B is a cross-sectional view taken along the line X-X of FIG. 2A.

FIG. 2A is a schematic plan view of the electronic substrate on which the insulating protective layer is formed in the first step, and FIG. 2B is a cross-sectional view taken along the line X-X of FIG. 2A.

Figure 3A:
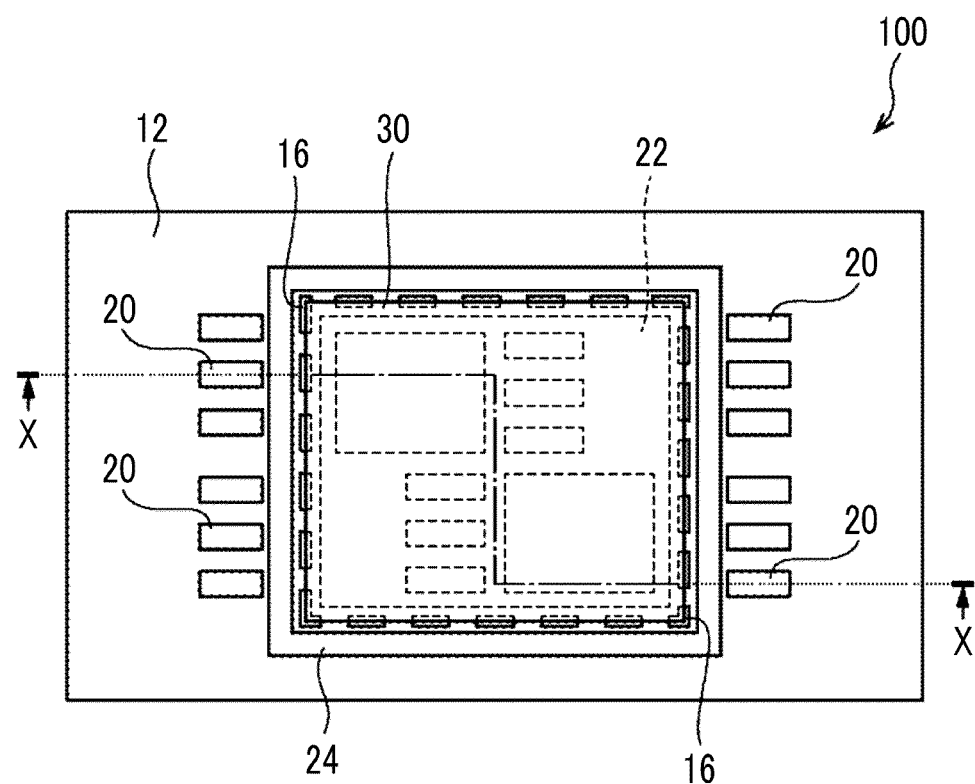
FIG. 3A is a schematic plan view of an electronic substrate (that is, an electronic device according to the embodiment of the present disclosure) on which an electromagnetic wave shielding layer is formed in a second step in the manufacturing method according to the embodiment of the present disclosure.
Figure 3B:
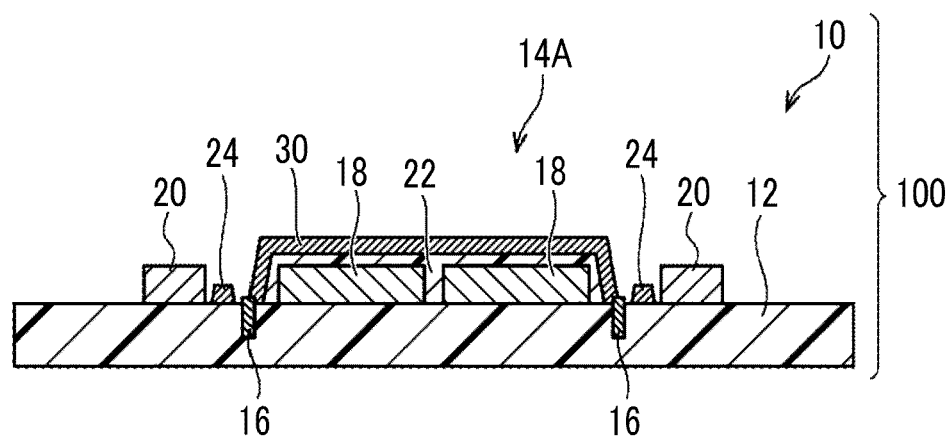
FIG. 3B is a cross-sectional view taken along the line X-X of FIG. 3A.

FIG. 3A is a schematic plan view of the electronic substrate (that is, the electronic device of the present embodiment) on which the electromagnetic wave shielding layer is formed in the second step, and FIG. 3B is a cross-sectional view taken along the line X-X of FIG. 3A.

—Preparation Step—

As shown in FIGS. 1A and 1B, in the preparation step in the present example, an electronic substrate 10 comprising a wiring board 12 having a mounting surface, a plurality of electronic components 18 and 20 mounted on the mounting surface of the wiring board 12, and a ground electrode 16 disposed to surround the electronic component 18 which is at least one of the plurality of electronic components 18 and 20 in plan view is prepared.

The preparation step may be a step of simply preparing the electronic substrate 10 manufactured in advance, or may be a step of manufacturing the electronic substrate 10.

As a manufacturing method of the electronic substrate 10, for example, a known manufacturing method of an electronic substrate in which an electronic component is mounted on a printed wiring board can be appropriately referred to.

As the wiring board 12, a substrate on which a wiring is formed, for example, a printed wiring board can be used.

The wiring board 12 may include an electrode other than the ground electrode 16, a solder resist layer, and the like.

The ground electrode 16 is an electrode to which a ground (GND) potential is applied.

In this example, the ground electrode 16 is disposed to surround the plurality of electronic components (electronic components 18).

In other words, the plurality of electronic components (electronic components 18) are mounted in a ground region 14A surrounded by the ground electrode 16.

In this example, the plurality of electronic components (electronic components 20) as conductive components are also mounted outside the ground region 14A.

As shown in FIG. 1A, the ground electrode 16 in this example is formed in a discontinuous pattern (specifically, a divided line pattern), but the ground electrode in the present disclosure is not limited to this example. For example, the ground electrode in the present disclosure may be formed as a continuous pattern (that is, a line pattern that is not divided).

In addition, the ground electrode 16 in this example is formed as an annular pattern that completely goes around the plurality of electronic components (electronic components 18).

However, the ground electrode 16 in the present disclosure is not limited to the annular pattern, and may be formed as, for example, a pattern in which at least a portion of the annular pattern is absent.

From the viewpoint of further reducing an influence of the electromagnetic waves from the outside on the plurality of electronic components (electronic components 18), the ground electrode 16 preferably surrounds a region where the plurality of electronic components are disposed by half or more, and more preferably surrounds the region by ¾ or more.

In addition, as shown in FIG. 1B, the ground electrode 16 in this example is formed such that a part of the ground electrode 16 in a thickness direction is embedded in the wiring board 12, but the ground electrode in the present disclosure is not limited to this example. For example, the ground electrode in the present disclosure may be formed such that the entirety of the ground electrode in the thickness direction is embedded. In addition, the ground electrode in the present disclosure may be formed on a surface of the wiring board 12 instead of being embedded in the wiring board 12. In addition, the ground electrode in the present disclosure may be formed as a pattern that penetrates the wiring board 12.

The plurality of electronic components 18 mounted in the ground region 14A may be electronic components having the same design or may be electronic components having different designs. In addition, the number of the electronic components mounted in the ground region is not limited to plural, and may be only one.

Similarly, the plurality of electronic components 20 mounted outside the ground region 14A may be electronic components having the same design or may be electronic components having different designs. In addition, the number of the electronic components mounted outside the ground region is not limited to plural, and may be only one.

Examples of each of the electronic components 18 and 20 include a semiconductor chip such as an integrated circuit (IC), a capacitor, and a transistor.

—First Step—

As shown in FIGS. 2A and 2B, in the first step, an insulating protective layer 22 that covers the plurality of electronic components 18 mounted in the ground region 14A is formed.

The insulating protective layer 22 is formed in a region that extends over the plurality of electronic components 18 and a periphery of the plurality of electronic components 18 in the ground region 14A.

The function of the insulating protective layer is, for example, a function of protecting the electronic components and a function of suppressing a short-circuit between the electronic components and other conductive members (for example, an electromagnetic wave shielding layer).

In the first step of this example, the insulating protective layer 22 and the insulating partition wall 24 are both formed in the same process by using an ink for forming an insulating protective layer (for example, an ink).

In the first step, the insulating partition wall 24 is formed along the outer edge of the ground electrode 16.

In the present disclosure, forming the insulating partition wall along the outer edge of the ground electrode means that the insulating partition wall is formed as a pattern that overlaps the outer edge of the ground electrode, or is formed as a pattern substantially parallel to the outer edge of the ground electrode.

The disposition of the outer edge of the ground electrode and an inner edge of the insulating partition wall in plan view may be such that the outer edge of the ground electrode and the inner edge of the insulating partition wall overlap each other, the inner edge of the insulating partition wall is disposed further outward than the outer edge of the ground electrode, and the inner edge of the insulating partition wall is disposed further inward than the outer edge of the ground electrode.

In the present disclosure, the term "substantially parallel" means that an absolute value of an intersecting angle is 15° or less.

In addition, the insulating partition wall does not need to extend along the entirety in a length direction of the outer edge of the ground electrode, and need only extend along at least a part of the edge in the length direction.

In addition, in this example, the insulating protective layer 22 and the insulating partition wall 24 are formed in the same step (that is, the first step), but a timing of forming the insulating partition wall in the manufacturing method according to the present embodiment is not limited to this example. The formation of the insulating partition wall in the manufacturing method according to the present embodiment need only be performed before the second step (that is, the step of forming the electromagnetic wave shielding layer). For example, the formation of the insulating partition wall may be performed after the first step and before the second step (that is, after the formation of the insulating protective layer), or may be performed after the preparation step and before the first step (that is, before the formation of the insulating protective layer).

A material (for example, a composition or a sheet material) for forming the insulating protective layer and a material (for example, a composition or a sheet material) for forming the insulating partition wall may be the same as or different from each other.

For the sheet material, for example, an insulating sheet material disclosed in JP2019-91866A can be referred to.

In the first step, as in the above example, it is preferable that the insulating protective layer and the insulating partition wall are formed by using the ink for forming an insulating protective layer.

As described above, the aspect in which the insulating protective layer and the insulating partition wall are formed in the same step by using the same composition is advantageous in terms of reducing the number of steps (that is, productivity of the electronic device) compared to an aspect in which the insulating protective layer and the insulating partition wall are formed in separate steps.

The ink for forming an insulating protective layer is preferably an active energy ray curable-type ink.

In a case in which the insulating protective layer and the insulating partition wall are formed by using the ink for forming an insulating protective layer in the first step, the ink for forming an insulating protective layer is preferably an active energy ray curable-type ink.

In a case in which the ink for forming an insulating protective layer is an active energy ray curable-type ink, it is advantageous from the viewpoint of productivity and particularly durability of the insulating partition wall.

An application method for applying the ink for forming an insulating protective layer onto the electronic substrate is not particularly limited.

The first step in a case in which the insulating protective layer and the insulating partition wall are formed by using the ink for forming an insulating protective layer is preferably a step of applying the ink for forming an insulating protective layer by an ink jet recording method, a dispenser method, or a spray method to form the insulating protective layer and the insulating partition wall.

By applying the ink for forming an insulating protective layer by an ink jet recording method, a dispenser method, or a spray method, it is particularly easy to form a pattern of the insulating partition wall that is a line-shaped pattern.

As the application method of the ink for forming an insulating protective layer, an ink jet recording method is particularly preferable.

A preferred aspect of the ink jet recording method as the application method of the ink for forming an insulating protective layer is the same as a preferred aspect of an ink jet recording method as an application method of the ink for forming an electromagnetic wave shielding layer, which will be described below.

—Second Step—

As shown in FIGS. 3A and 3B, in the second step, an electromagnetic wave shielding layer 30 that extends over the insulating protective layer 22 and at least a part of the ground electrode 16 and that covers the insulating protective layer 22 and is electrically connected to the ground electrode 16, the electromagnetic wave shielding layer 30 being a solidified product of the ink for forming an electromagnetic wave shielding layer, is formed by using the ink for forming an electromagnetic wave shielding layer.

The electromagnetic wave shielding layer 30 is formed by applying the ink for forming an electromagnetic wave shielding layer into the ground region 14A and solidifying the ink for forming an electromagnetic wave shielding layer.

Preferred ranges of the ink for forming an electromagnetic wave shielding layer and a method for forming an electromagnetic wave shielding layer will be described below.

The electromagnetic wave shielding layer is a layer for reducing the influence of electromagnetic waves on the electronic components by shielding the electromagnetic waves applied to the electronic components.

In the present disclosure, the performance of such an electromagnetic wave shielding layer is also referred to as "electromagnetic wave-shielding properties".

The electromagnetic wave-shielding properties of the electromagnetic wave shielding layer are exhibited by disposing the electromagnetic wave shielding layer on the electronic components with the insulating protective layer being interposed therebetween.

In addition, the electromagnetic wave-shielding properties of the electromagnetic wave shielding layer are exhibited in a case in which a ground (GND) potential is applied to the electromagnetic wave shielding layer. Therefore, the electromagnetic wave shielding layer has conductivity as a premise of the electromagnetic wave shielding layer.

In the manufacturing method according to the present example, in a case in which the ink for forming an electromagnetic wave shielding layer is applied into the ground region 14A and solidified to form the electromagnetic wave shielding layer 30, the insulating partition wall 24 along the outer edge of the ground electrode 16 already exists.

Thereby, even in a case in which the ink for forming an electromagnetic wave shielding layer is about to flow out of the ground region 14A, the ink for forming an electromagnetic wave shielding layer is dammed by the insulating partition wall 24, and as a result, the outflow of the ink for forming an electromagnetic wave shielding layer is suppressed.

As a result, the electromagnetic wave shielding layer is formed inside the inner edge of the insulating partition wall 24 or in contact with the inner edge of the insulating partition wall 24. Therefore, a defect (for example, a short-circuit) caused by the outflow of the ink for forming an electromagnetic wave shielding layer is suppressed.

Hereinafter, preferred ranges of the electronic device and the manufacturing method of the electronic device of the present disclosure will be described.

<Relationship Between Height of Insulating Partition Wall and Height of Insulating Protective Layer>

A height of the insulating partition wall (for example, the insulating partition wall 24) is preferably lower than a height of the insulating protective layer (insulating protective layer 22) on the electronic component (for example, the electronic component 18) in the ground region.

Thereby, formation stability of the electromagnetic wave shielding layer is further improved.

Specifically, in a case of forming the electromagnetic wave shielding layer in the present disclosure, an application member (for example, a jetting nozzle) for applying the ink for forming an electromagnetic wave shielding layer is moved from the outside of the ground region onto the insulating protective layer in the ground region, and applies the ink for forming an electromagnetic wave shielding layer at this position. In the above-described preferred aspect, since the height of the insulating partition wall is relatively low as compared with the height of the insulating protective layer on the electronic component, the insulating partition wall is less likely to interfere the movement of the application member (for example, a jetting nozzle) onto the insulating protective layer. Therefore, the formation stability in a case of forming the electromagnetic wave shielding layer on the insulating protective layer is further improved.

From the viewpoint of further improving the formation stability of the electromagnetic wave shielding layer, the height of the insulating partition wall is preferably lower than the height of the insulating protective layer on the electronic component by 1 μm or more, more preferably lower than the height of the insulating protective layer by 3 μm or more, and still more preferably lower than the height of the insulating protective layer by 5 μm or more.

An upper limit of a value obtained by subtracting the height of the insulating partition wall from the height of the insulating protective layer on the electronic component is not particularly limited, and is, for example, 3000 μm.

Here, both the height of the insulating partition wall and the height of the insulating protective layer on the electronic component (for example, the height of the insulating partition wall 24 and the height of the insulating protective layer 22 on the electronic component 18 in FIG. 2B) are heights (that is, heights of highest points) based on the mounting surface of the wiring board.

A relationship between the height of the insulating partition wall and the height of the insulating protective layer (specifically, which one is higher and a difference in height) is measured based on an optical micrograph obtained by imaging a cross section of the electronic device.

The height of the insulating partition wall is preferably 3 μm or more, more preferably 10 μm or more, still more preferably 15 μm or more, and still more preferably 18 μm or more.

In addition, the height of the insulating partition wall is preferably 1100 μm or less, more preferably 800 μm or less, and still more preferably 500 μm or less.

The height of the insulating protective layer on the electronic component in the ground region depends on the height of the electronic component, but is preferably 50 μm or more, more preferably 100 μm or more, and still more preferably 200 μm or more.

The height of the insulating protective layer on the electronic component in the ground region depends on a thickness of the electronic component, but is preferably 1500 μm or less, and more preferably 1000 μm or less.

The height of the electronic component is preferably 100 μm or more, more preferably 200 μm or more, and still more preferably 300 μm or more.

The height of the electronic component is preferably 2000 μm or less, and more preferably 1000 μm or less.

<Relationship Between Height of Insulating Partition Wall and Height of Ground Electrode>

The height of the insulating partition wall is preferably higher than a height of the ground electrode from a surface of the substrate.

Thereby, the effect of the insulating partition wall to suppress the outflow of the ink for forming an electromagnetic wave shielding layer (specifically, effect of damming up the ink for forming an electromagnetic wave shielding layer that is about to flow out) is more effectively exhibited.

From the viewpoint of further suppressing the outflow of the ink for forming an electromagnetic wave shielding layer, the height of the insulating partition wall is preferably higher than the height of the ground electrode by 1 μm or more, more preferably higher than the height of the insulating protective layer by 3 μm or more, and still more preferably higher than the height of the insulating protective layer by 5 μm or more.

An upper limit of a value obtained by subtracting the height of the ground electrode from the height of the insulating partition wall is not particularly limited, and is, for example, 1000 μm.

Here, both the height of the insulating partition wall and the height of the ground electrode (for example, the height of the insulating partition wall 24 and the height of the ground electrode 16 in FIG. 2B) are heights (that is, heights of highest points) based on the mounting surface (mounting surface 12S in FIG. 4) of the wiring board.

A relationship between the height of the insulating partition wall and the height of the ground electrode (specifically, which one is higher and a difference in height) is measured based on an optical micrograph obtained by imaging a cross section of the electronic device.

The height of the ground electrode is preferably −10 μm or more, more preferably 0 μm or more, and still more preferably 5 μm or more.

The height of the ground electrode is preferably 100 μm or less, more preferably 50 μm or less, and still more preferably 30 μm or less.

<Aspect Ratio [Height/Thickness] of Insulating Partition Wall>

A ratio of the height of the insulating partition wall to a thickness of the insulating partition wall (hereinafter, also referred to as an "aspect ratio [height/thickness] of the insulating partition wall") is preferably 0.01 to 10, more preferably 0.02 to 5.0 and still more preferably 0.03 to 4.0.

In a case in which the aspect ratio [height/thickness] of the insulating partition wall is 0.01 or more, the effect of the insulating partition wall to suppress the outflow of the ink for forming an electromagnetic wave shielding layer (specifically, effect of damming up the ink for forming an electromagnetic wave shielding layer that is about to flow out) is more effectively exhibited.

In a case in which the aspect ratio [height/thickness] of the insulating partition wall is 10 or less, the durability of the insulating partition wall is further improved (for example, breakage, chipping, and the like are further suppressed).

Here, the height of the insulating partition wall is a height from the mounting surface of the wiring board, and the thickness of the insulating partition wall is the maximum thickness of the insulating partition wall in a cross section perpendicular to a length direction of the insulating partition wall (that is, a cross section parallel to a height direction and a thickness direction of the insulating partition wall).

The aspect ratio [height/thickness] of the insulating partition wall is measured based on an optical micrograph obtained by imaging the cross section of the insulating partition wall. A preferred range of the height of the insulating partition wall is as described above.

The thickness of the insulating partition wall is preferably 5 μm or more, more preferably 10 μm or more, and still more preferably 50 μm or more.

In addition, the thickness of the insulating partition wall is preferably 2200 μm or less, more preferably 1000 μm or less, and still more preferably 500 μm or less.

<Cross-Sectional Shape of Insulating Partition Wall>

A cross-sectional shape of the above-described cross section of the insulating partition wall is not particularly limited.

Figure 4:
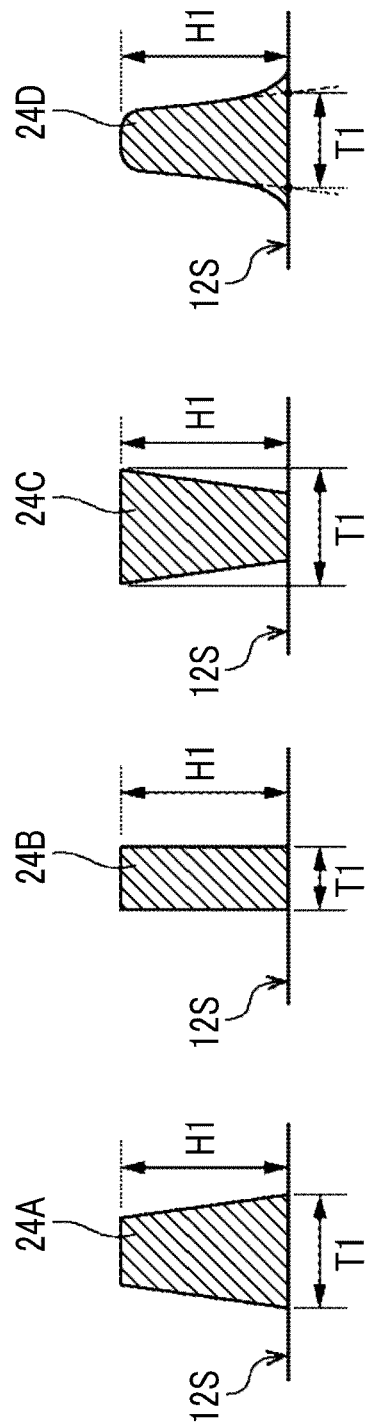
FIG. 4 is a schematic cross-sectional view showing a variation of a cross-sectional shape of an insulating partition wall in the electronic device according to the embodiment of the present disclosure.

FIG. 4 is a schematic cross-sectional view showing a variation of the cross-sectional shape of the insulating partition wall, and shows a cross section perpendicular to the length direction of the insulating partition wall (that is, a cross section parallel to a height direction and a thickness direction of the insulating partition wall).

In FIG. 4, an insulating partition wall 24A whose cross section has a trapezoidal shape, an insulating partition wall 24B whose cross section has a rectangular shape, an insulating partition wall 24C whose cross section has a reverse tapered shape, and an insulating partition wall 24D whose cross section has a trapezoidal shape with thermal sagging are all specific examples of the insulating partition wall in the present disclosure.

As described above, a height H1 of each insulating partition wall is defined as a height from the mounting surface 12S of the wiring board.

A thickness T1 of each insulating partition wall is the maximum thickness of the insulating partition wall in the insulating partition wall 24A whose cross section has a trapezoidal shape, the insulating partition wall 24B whose cross section has a rectangular shape, and the insulating partition wall 24C whose cross section has a reverse tapered shape.

In the insulating partition wall 24D whose cross section has a trapezoidal shape with thermal sagging, a tangent line is drawn to both side walls of the insulating partition wall 24D to obtain intersections (two intersections) between the tangent line and the mounting surface 12S of the wiring board, and a distance between these intersections is defined as the thickness T1 of the insulating partition wall.

As the cross-sectional shape of the insulating partition wall, a trapezoidal shape (for example, the shape of the insulating partition wall 24A) or a rectangular shape (for example, the shape of the insulating partition wall 24B) is particularly preferable.

Next, preferred aspects of the ink for forming an electromagnetic wave shielding layer, the method for forming an electromagnetic wave shielding layer, the ink for forming an insulating protective layer, and a method for forming an insulating protective layer will be described <Ink for Forming Electromagnetic Wave Shielding Layer>

The electromagnetic wave shielding layer in the present disclosure is a solidified product of the ink for forming an electromagnetic wave shielding layer.

That is, the electromagnetic wave shielding layer in the present disclosure is formed by applying the ink for forming an electromagnetic wave shielding layer and solidifying the ink for forming an electromagnetic wave shielding layer.

As the ink for forming an electromagnetic wave shielding layer, an ink containing metal particles (hereinafter, also referred to as a "metal particle ink"), an ink containing a metal complex (hereinafter, also referred to as a "metal complex ink"), or an ink containing a metal salt (hereinafter, also referred to as a "metal salt ink") is preferable, and a metal salt ink or a metal complex ink is more preferable.

(Metal Particle Ink)

The metal particle ink is, for example, an ink composition obtained by dispersing metal particles in a dispersion medium.

—Metal Particles—

Examples of the metal constituting the metal particles include base metal and noble metal particles. Examples of the base metal include nickel, titanium, cobalt, copper, chromium, manganese, iron, zirconium, tin, tungsten, molybdenum, and vanadium. Examples of the noble metal include gold, silver, platinum, palladium, iridium, osmium, ruthenium, rhodium, rhenium, and alloys containing these metals. Among these, from the viewpoint of the electromagnetic wave-shielding properties, the metal constituting the metal particles preferably includes at least one selected from the group consisting of silver, gold, platinum, nickel, palladium, and copper, and more preferably includes silver.

An average particle diameter of the metal particles is not particularly limited, but is preferably 10 nm to 500 nm, and more preferably 10 nm to 200 nm. In a case in which the average particle diameter is in the above range, a baking temperature of the metal particles is lowered, which improves process suitability for forming the electromagnetic wave shielding layer. Particularly, in a case in which the metal particle ink is applied by using a spray method or an ink jet recording method, jettability is improved, which tends to improve pattern forming properties and film thickness uniformity of the electromagnetic wave shielding layer. The average particle diameter mentioned herein means an average value of primary particle diameters of the metal particles (average primary particle diameter).

The average particle diameter of the metal particles is measured by a laser diffraction/scattering method. The average particle diameter of the metal particles is, for example, a value obtained by measuring a 50% cumulative volume-based diameter (D50) three times and calculating an average value of D50 measured three times, and can be measured by using a laser diffraction/scattering-type particle size distribution analyzer (trade name "LA-960" manufactured by Horiba, Ltd.).

In addition, the metal particle ink may contain metal particles having an average particle diameter of 500 nm or more, as necessary. In a case in which the metal particle ink contains metal particles having an average particle diameter of 500 nm or more, a melting point of the nm-sized metal particles is lowered around the μm-sized metal particles, which makes it possible to bond the electromagnetic wave shielding layer.

The content of the metal particles in the metal particle ink is preferably 10% by mass to 90% by mass, and more preferably 20% by mass to 50% by mass, with respect to the total amount of the metal particle ink. In a case in which the content of the metal particles is 10% by mass or more, a surface resistivity is further reduced. In a case in which the content of the metal particles is 90% by mass or less, jettability is improved in a case in which the metal particle ink is applied by using an ink jet recording method.

In addition to the metal particles, the metal particle ink may contain, for example, a dispersing agent, a resin, a dispersion medium, a thickener, and a surface tension adjuster.

—Dispersing Agent—

The metal particle ink may contain a dispersing agent that adheres to at least a part of a surface of the metal particles. The dispersing agent substantially constitutes metal colloidal particles, together with the metal particles. The dispersing agent has an action of coating the metal particles to improve dispersibility of the metal particles and prevent aggregation. The dispersing agent is preferably an organic compound capable of forming the metal colloidal particles. From the viewpoint of the electromagnetic wave-shielding properties and dispersion stability, the dispersing agent is preferably an amine, a carboxylic acid, an alcohol, or a resin dispersing agent.

The metal particle ink may contain one dispersing agent or two or more dispersing agents.

Examples of the amine include saturated or unsaturated aliphatic amines. Among these, the amine is preferably an aliphatic amine having 4 to 8 carbon atoms. The aliphatic amine having 4 to 8 carbon atoms may be linear or branched, or may have a ring structure.

Examples of the aliphatic amine include butylamine, normal pentylamine, isopentylamine, hexylamine, 2-ethylhexylamine, and octylamine.

Examples of the amine having an alicyclic structure include cycloalkylamines such as cyclopentylamine and cyclohexylamine.

Examples of an aromatic amine include aniline.

The amine may have a functional group other than an amino group. Examples of the functional group other than an amino group include a hydroxy group, a carboxy group, an alkoxy group, a carbonyl group, an ester group, and a mercapto group.

Examples of the carboxylic acid include formic acid, oxalic acid, acetic acid, hexanoic acid, acrylic acid, octylic acid, oleic acid, tianshic acid, ricinoleic acid, gallic acid, and salicylic acid. A carboxy group, which is a part of the carboxylic acid, may form a salt with a metal ion. The salt may be formed of one metal ion or two or more metal ions.

The carboxylic acid may have a functional group other than the carboxy group. Examples of the functional group other than the carboxy group include an amino group, a hydroxy group, an alkoxy group, a carbonyl group, an ester group, and a mercapto group.

Examples of the alcohol include a terpene-based alcohol, an allyl alcohol, and an oleyl alcohol. The alcohol is likely to be coordinated with the surface of the metal particles, and can suppress the aggregation of the metal particles.

Examples of the resin dispersing agent include a dispersing agent that has a nonionic group as a hydrophilic group and can be uniformly dissolved in a solvent. Examples of the resin dispersing agent include polyvinylpyrrolidone, polyethylene glycol, a polyethylene glycol-polypropylene glycol copolymer, polyvinyl alcohol, polyallylamine, and a polyvinyl alcohol-polyvinyl acetate copolymer. A molecular weight of the resin dispersing agent is preferably 1000 to 50000, and more preferably 1000 to 30000, in terms of a weight-average molecular weight.

The content of the dispersing agent in the metal particle ink is preferably 0.5% by mass to 50% by mass, and more preferably 1% by mass to 30% by mass, with respect to the total amount of the metal particle ink.

—Dispersion Medium—

The metal particle ink preferably contains a dispersion medium. A type of the dispersion medium is not particularly limited, and examples thereof include a hydrocarbon, an alcohol, and water.

The metal particle ink may contain one dispersion medium or two or more dispersion media. The dispersion medium contained in the metal particle ink is preferably volatile. A boiling point of the dispersion medium is preferably 50° C. to 250° C., more preferably 70° C. to 220° C., and still more preferably 80° C. to 200° C. In a case in which the boiling point of the dispersion medium is 50° C. to 250° C., the stability and baking properties of the metal particle ink tend to be simultaneously achieved.

Examples of the hydrocarbon include an aliphatic hydrocarbon and an aromatic hydrocarbon.

Examples of the aliphatic hydrocarbon include a saturated or unsaturated aliphatic hydrocarbon such as tetradecane, octadecane, heptamethylnonane, tetramethylpentadecane, hexane, heptane, octane, nonane, decane, tridecane, methylpentane, normal paraffin, or isoparaffin.

Examples of the aromatic hydrocarbon include toluene and xylene.

Examples of the alcohol include an aliphatic alcohol and an alicyclic alcohol. In a case in which an alcohol is used as the dispersion medium, the dispersing agent is preferably an amine or a carboxylic acid.

Examples of the aliphatic alcohol include a saturated or unsaturated aliphatic alcohol having 6 to 20 carbon atoms that may contain an ether bond in a chain, such as heptanol, octanol (for example, 1-octanol, 2-octanol, or 3-octanol), decanol (for example, 1-decanol), lauryl alcohol, tetradecyl alcohol, cetyl alcohol, 2-ethyl-1-hexanol, octadecyl alcohol, hexadecenol, and oleyl alcohol.

Examples of the alicyclic alcohol include a cycloalkanol such as cyclohexanol; a terpene alcohol such as terpineol (including α, β, and γ isomers, or any mixture of these) or dihydroterpineol; myrtenol, sobrerol, menthol, carveol, perillyl alcohol, pinocarveol, and verbenol.

The dispersion medium may be water. From the viewpoint of adjusting physical properties such as viscosity, surface tension, and volatility, the dispersion medium may be a mixed solvent of water and another solvent. Another solvent to be mixed with water is preferably an alcohol. The alcohol used together with water is preferably an alcohol that is miscible with water and has a boiling point of 130° C. or lower. Examples of the alcohol include 1-propanol, 2-propanol, 1-butanol, 2-butanol, tert-butanol, 1-pentanol, ethylene glycol monomethyl ether, ethylene glycol monoethyl ether, ethylene glycol monopropyl ether, propylene glycol monomethyl ether.

The content of the dispersion medium in the metal particle ink is preferably 1% by mass to 50% by mass, with respect to the total amount of the metal particle ink. In a case in which the content of the dispersion medium is 1% by mass to 50% by mass, the metal particle ink can obtain sufficient conductivity as the ink for forming an electromagnetic wave shielding layer. The content of the dispersion medium is more preferably 10% by mass to 45% by mass, and still more preferably 20% by mass to 40% by mass.

—Resin—

The metal particle ink may contain a resin. Examples of the resin include polyester, polyurethane, a melamine resin, an acrylic resin, a styrene-based resin, a polyether, and a terpene resin.

The metal particle ink may contain one resin or two or more resins.

The content of the resin in the metal particle ink is preferably 0.1% by mass to 5% by mass with respect to the total amount of the metal particle ink.

—Thickener—

The metal particle ink may contain a thickener. Examples of the thickener include clay minerals such as clay, bentonite, and hectorite; cellulose derivatives such as methyl cellulose, carboxymethyl cellulose, hydroxyethyl cellulose, hydroxypropyl cellulose, and hydroxypropyl methyl cellulose; and polysaccharides such as xanthan gum and guar gum.

The metal particle ink may contain one thickener or two or more thickeners.

The content of the thickener in the metal particle ink is preferably 0.1% by mass to 5% by mass with respect to the total amount of the metal particle ink.

—Surfactant—

The metal particle ink may contain a surfactant. In a case in which the metal particle ink contains a surfactant, a uniform electromagnetic wave shielding layer is likely to be formed.

The surfactant may be any of an anionic surfactant, a cationic surfactant, or a nonionic surfactant. Among these, the surfactant is preferably a fluorine-based surfactant from the viewpoint of being able to adjust the surface tension with a small amount of content. In addition, the surfactant is preferably a compound having a boiling point higher than 250° C.

The viscosity of the metal particle ink is not particularly limited. The viscosity of the metal particle ink need only be 0.01 Pa·s to 5000 Pa·s, and is preferably 0.1 Pa·s to 100 Pa·s. In a case in which the metal particle ink is applied by using a spray method or an ink jet recording method, the viscosity of the metal particle ink is preferably 1 mPa·s to 100 mPa·s, more preferably 2 mPa·s to 50 mPa·s, and still more preferably 3 mPa·s to 30 mPa·s.

The viscosity of the metal particle ink is a value measured at 25° C. by using a viscometer. The viscosity is measured using, for example, a VISCOMETER TV-22 type viscometer (manufactured by Toki Sangyo Co., Ltd.).

The surface tension of the metal particle ink is not particularly limited, and is preferably 20 mN/m to 45 mN/m and more preferably 25 mN/m to 40 mN/m.

The surface tension is a value measured at 25° C. by using a surface tension meter.

The surface tension of the metal particle ink is measured using, for example, DY-700 (manufactured by Kyowa Interface Science Co., Ltd.).

—Manufacturing Method of Metal Particles—

The metal particles may be a commercially available product or may be manufactured by a known method. Examples of a manufacturing method of the metal particles include a wet reduction method, a vapor phase method, and a plasma method. Preferred examples of the manufacturing method of the metal particles include a wet reduction method capable of manufacturing metal particles having an average particle diameter of 200 nm or less and having a narrow particle size distribution. Examples of the manufacturing method of the metal particles by a wet reduction method include the method disclosed in JP2017-37761A, WO2014-57633A, and the like, the method including: a step of mixing a metal salt with a reducing agent to obtain a complexing reaction solution; and a step of heating the complexing reaction solution to reduce metal ions in the complexing reaction solution and to obtain a slurry of metal nanoparticles.

In manufacturing the metal particle ink, a heat treatment may be performed such that the content of each component contained in the metal particle ink is adjusted to be in a predetermined range. The heat treatment may be performed under reduced pressure or under normal pressure. In a case in which the heat treatment is performed under normal pressure, the heat treatment may be performed in the atmospheric air or in an inert gas atmosphere.

(Metal Complex Ink)

The metal complex ink is, for example, an ink composition obtained by dissolving a metal complex in a solvent.

—Metal Complex—

Examples of metals constituting the metal complex include silver, copper, gold, aluminum, magnesium, tungsten, molybdenum, zinc, nickel, iron, platinum, tin, and lead. Among these, from the viewpoint of the electromagnetic wave-shielding properties, the metal constituting the metal complex preferably includes at least one selected from the group consisting of silver, gold, platinum, nickel, palladium, and copper, and more preferably includes silver.

The content of the metal contained in the metal complex ink is preferably 1% by mass to 40% by mass, more preferably 5% by mass to 30% by mass, and still more preferably 7% by mass to 20% by mass, with respect to the total amount of the metal complex ink, in terms of the metal element.

The metal complex can be obtained, for example, by reacting a metal salt with a complexing agent. Examples of a manufacturing method of the metal complex include a method of adding a metal salt and a complexing agent to an organic solvent and stirring the mixture for a predetermined time. The stirring method is not particularly limited, and can be appropriately selected from known methods such as a stirring method using a stirrer, a stirring blade, or a mixer, and a method of applying ultrasonic waves.

Examples of the metal salt include a metal oxide, thiocyanate, sulfide, chloride, cyanide, cyanate, carbonate, acetate, nitrate, nitrite, sulfate, phosphate, perchlorate, tetrafluoroborate, an acetyl acetonate complex salt, and carboxylate.

Examples of the complexing agent include an amine, an ammonium carbamate-based compound, an ammonium carbonate-based compound, an ammonium bicarbonate compound, and a carboxylic acid. Among these, from the viewpoint of the electromagnetic wave-shielding properties and stability of the metal complex, the complexing agent preferably includes at least one selected from the group consisting of an ammonium carbamate-based compound, an ammonium carbonate-based compound, an amine, and a carboxylic acid having 8 to 20 carbon atoms.

The metal complex has a structure derived from a complexing agent, and preferably has a structure derived from at least one selected from the group consisting of an ammonium carbamate-based compound, an ammonium carbonate-based compound, an amine, and a carboxylic acid having 8 to 20 carbon atoms.

Examples of the amine as a complexing agent include ammonia, a primary amine, a secondary amine, a tertiary amine, and a polyamine.

Examples of the primary amine having a linear alkyl group include methylamine, ethylamine, 1-propylamine, n-butylamine, n-pentylamine, n-hexylamine, heptylamine, octylamine, nonylamine, n-decylamine, undecylamine, dodecylamine, tridecylamine, tetradecylamine, pentadecylamine, hexadecylamine, heptadecylamine, and octadecylamine.

Examples of the primary amine having a branched alkyl group include isopropylamine, sec-butylamine, tert-butylamine, isopentylamine, 2-ethylhexylamine, and tert-octylamine.

Examples of the primary amine having an alicyclic structure include cyclohexylamine and dicyclohexylamine.

Examples of the primary amine having a hydroxyalkyl group include ethanolamine, diethanolamine, triethanolamine, N-methylethanolamine, propanolamine, isopropanolamine, dipropanolamine, diisopropanolamine, tripropanolamine, and triisopropanolamine.

Examples of the primary amine having an aromatic ring include benzylamine, N,N-dimethylbenzylamine, phenylamine, diphenylamine, triphenylamine, aniline, N,N-dimethylaniline, N,N-dimethyl-p-toluidine, 4-aminopyridine, and 4-dimethylaminopyridine.

Examples of the secondary amine include dimethylamine, diethylamine, dipropylamine, dibutylamine, diphenylamine, dicyclopentylamine, and methylbutylamine.

Examples of the tertiary amine include trimethylamine, triethylamine, tripropylamine, and triphenylamine.

Examples of the polyamine include ethylenediamine, 1,3-diaminopropane, diethylenetriamine, triethylenetetramine, tetramethylenepentamine, hexamethylenediamine, tetraethylenepentamine, and a combination of these.

The amine is preferably an alkylamine, more preferably an alkylamine having 3 to 10 carbon atoms, and still more preferably a primary alkylamine having 4 to 10 carbon atoms. The metal complex may be configured of one amine or two or more amines.

In reacting the metal salt with an amine, a ratio of the molar amount of the amine to a molar amount of the metal salt is preferably 1/1 to 15/1, and more preferably 1.5/1 to 6/1. In a case in which the above ratio is within the above range, the complex formation reaction is completed, and a transparent solution is obtained.

Examples of the ammonium carbamate-based compound as a complexing agent include ammonium carbamate, methylammonium methylcarbamate, ethylammonium ethylcarbamate, 1-propylammonium 1-propylcarbamate, isopropylammonium isopropylcarbamate, butylammonium butylcarbamate, isobutylammonium isobutylcarbamate, amylammonium amylcarbamate, hexylammonium hexylcarbamate, heptylammonium heptylcarbamate, octylammonium octylcarbamate, 2-ethylhexylammonium 2-ethylhexylcarbamate, nonylammonium nonylcarbamate, and decylammonium decylcarbamate.

Examples of the ammonium carbonate-based compound as a complexing agent include ammonium carbonate, methylammonium carbonate, ethylammonium carbonate, 1-propylammonium carbonate, isopropylammonium carbonate, butylammonium carbonate, isobutylammonium carbonate, amylammonium carbonate, hexylammonium carbonate, heptylammonium carbonate, octylammonium carbonate, 2-ethylhexylammonium carbonate, nonylammonium carbonate, and decylammonium carbonate.

Examples of the ammonium bicarbonate-based compound as a complexing agent include ammonium bicarbonate, methylammonium bicarbonate, ethylammonium bicarbonate, 1-propylammonium bicarbonate, isopropylammonium bicarbonate, butylammonium bicarbonate, isobutylammonium bicarbonate, amylammonium bicarbonate, hexylammonium bicarbonate, heptylammonium bicarbonate, octylammonium bicarbonate, 2-ethylhexylammonium bicarbonate, nonylammonium bicarbonate, and decylammonium bicarbonate.

In reacting the metal salt with an ammonium carbamate-based compound, an ammonium carbonate-based compound, or an ammonium bicarbonate-based compound, a ratio of a molar amount of the ammonium carbamate-based compound, the ammonium carbonate-based compound, or the ammonium bicarbonate-based compound to the molar amount of the metal salt is preferably 0.01/1 to 1/1, and more preferably 0.05/1 to 0.6/1.

Examples of the carboxylic acid as a complexing agent include caproic acid, caprylic acid, pelargonic acid, 2-ethylhexanoic acid, capric acid, neodecanoic acid, undecanoic acid, lauric acid, myristic acid, palmitic acid, stearic acid, palmitoleic acid, oleic acid, linoleic acid, and linolenic acid. Among these, the carboxylic acid is preferably a carboxylic acid having 8 to 20 carbon atoms, and more preferably a carboxylic acid having 10 to 16 carbon atoms.

The content of the metal complex in the metal complex ink is preferably 10% by mass to 90% by mass, and more preferably 10% by mass to 40% by mass, with respect to the total amount of the metal complex ink. In a case in which the content of the metal complex is 10% by mass or more, the surface resistivity is further reduced. In a case in which the content of the metal complex is 90% by mass or less, jettability is improved in a case in which the metal particle ink is applied by using an ink jet recording method.

—Solvent—

The metal complex ink preferably contains a solvent. The solvent is not particularly limited as long as it can dissolve the component contained in the metal complex ink, such as the metal complex. From the viewpoint of ease of manufacturing, a boiling point of the solvent is preferably 30° C. to 300° C., more preferably 50° C. to 200° C., and still more preferably 50° C. to 150° C.

The content of the solvent in the metal complex ink is preferably set such that the concentration of metal ions with respect to the metal complex (the amount of the metal present as free ions with respect to 1 g of the metal complex) is 0.01 mmol/g to 3.6 mmol/g, and more preferably set such that the concentration of metal ions is 0.05 mmol/g to 2 mmol/g. In a case in which the concentration of metal ions is within the above range, the metal complex ink has excellent fluidity and can obtain the electromagnetic wave-shielding properties.

Examples of the solvent include a hydrocarbon, a cyclic hydrocarbon, an aromatic hydrocarbon, a carbamate, an alkene, an amide, an ether, an ester, an alcohol, a thiol, a thioether, phosphine, and water. The metal complex ink may contain only one solvent or two or more solvents.

The hydrocarbon is preferably a linear or branched hydrocarbon having 6 to 20 carbon atoms. Examples of the hydrocarbon include pentane, hexane, heptane, octane, nonane, decane, undecane, dodecane, tridecane, tetradecane, pentadecane, hexadecane, octadecane, nonadecane, and icosane.

The cyclic hydrocarbon is preferably a cyclic hydrocarbon having 6 to 20 carbon atoms. The cyclic hydrocarbons can include, for example, cyclohexane, cycloheptane, cyclooctane, cyclononane, cyclodecane, and decalin.

Examples of the aromatic hydrocarbon include benzene, toluene, xylene, and tetraline.

The ether may be any of a linear ether, a branched ether, or a cyclic ether. Examples of the ether include diethyl ether, dipropyl ether, dibutyl ether, methyl-t-butyl ether, tetrahydrofuran, tetrahydropyrane, dihydropyrane, and 1,4-dioxane.

The alcohol may be any of a primary alcohol, a secondary alcohol, or a tertiary alcohol.

Examples of the alcohol include ethanol, 1-propanol, 2-propanol, 1-methoxy-2-propanol, 1-butanol, 2-butanol, 1-pentanol, 2-pentanol, 3-pentanol, 1-hexanol, 2-hexanol, 3-hexanol, 1-octanol, 2-octanol, 3-octanol, tetrahydrofurfuryl alcohol, cyclopentanol, terpineol, decanol, isodecyl alcohol, lauryl alcohol, isolauryl alcohol, myristyl alcohol, isomyristyl alcohol, cetyl alcohol (cetanol), isocetyl alcohol, stearyl alcohol, isostearyl alcohol, oleyl alcohol, isooleyl alcohol, linoleyl alcohol, isolinoleyl alcohol, palmityl alcohol, isopalmityl alcohol, icosyl alcohol, and isoicosyl alcohol.

Examples of the ketone include acetone, methyl ethyl ketone, methyl isobutyl ketone, and cyclohexanone.

Examples of the ester include methyl acetate, ethyl acetate, isopropyl acetate, butyl acetate, isobutyl acetate, sec-butyl acetate, methoxybutyl acetate, ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, propylene glycol monomethyl ether acetate, propylene glycol monoethyl ether acetate, propylene glycol monobutyl ether acetate, dipropylene glycol monomethyl ether acetate, dipropylene glycol monoethyl ether acetate, dipropylene glycol monobutyl ether acetate, and 3-methoxybutyl acetate.

—Reducing Agent—

The metal complex ink may contain a reducing agent. In a case in which the metal complex ink contains a reducing agent, reduction of the metal complex into a metal is facilitated.

Examples of the reducing agent include a borohydride metal salt, an aluminum hydride salt, an amine, an alcohol, an organic acid, reduced sugar, a sugar alcohol, sodium sulfite, a hydrazine compound, dextrin, hydroquinone, hydroxylamine, ethylene glycol, glutathione, and an oxime compound.

The reducing agent may be the oxime compound disclosed in JP2014-516463A. Examples of the oxime compound include acetone oxime, cyclohexanone oxime, 2-butanone oxime, 2,3-butanedione monoxime, dimethyl glyoxime, methyl acetoacetate monoxime, methyl pyruvate monoxime, benzaldehyde oxime, 1-indanone oxime, 2-adamantanone oxime, 2-methylbenzamide oxime, 3-methylbenzamide oxime, 4-methylbenzamide oxime, 3-aminobenzamide oxime, 4-aminobenzamide oxime, acetophenone oxime, benzamide oxime, and pinacolone oxime.

The metal complex ink may contain one reducing agent or two or more reducing agents.

The content of the reducing agent in the metal complex ink is not particularly limited, but is preferably 0.1% by mass to 20% by mass, more preferably 0.3% by mass to 10% by mass, and still more preferably 1% by mass to 5% by mass, with respect to the total amount of the metal complex ink.

—Resin—

The metal complex ink may contain a resin. In a case in which the metal complex ink contains a resin, adhesiveness of the metal complex ink to the substrate is improved.

Examples of the resin include polyester, polyethylene, polypropylene, polyacetal, polyolefin, polycarbonate, polyamide, a fluororesin, a silicone resin, ethyl cellulose, hydroxyethyl cellulose, rosin, an acrylic resin, polyvinyl chloride, polysulfone, polyvinylpyrrolidone, polyvinyl alcohol, a polyvinyl-based resin, polyacrylonitrile, polysulfide, polyamideimide, polyether, polyarylate, polyether ether ketone, polyurethane, an epoxy resin, a vinyl ester resin, a phenol resin, a melamine resin, and a urea resin.

The metal complex ink may contain one resin or two or more resins.

—Additive—

As long as the effects of the present disclosure are not reduced, the metal complex ink may further contain additives such as an inorganic salt, an organic salt, an inorganic oxide such as silica, a surface conditioner, a wetting agent, a crosslinking agent, an antioxidant, a rust inhibitor, a heat-resistant stabilizer, a surfactant, a plasticizer, a curing agent, a thickener, and a silane coupling agent. The total content of the additives in the metal complex ink is preferably 20% by mass or less with respect to the total amount of the metal complex ink.

The viscosity of the metal complex ink is not particularly limited. The viscosity of the metal complex ink need only be 0.01 Pa·s to 5000 Pa·s, and is preferably 0.1 Pa·s to 100 Pa·s. In a case in which the metal complex ink is applied by using a spray method or an ink jet recording method, the viscosity of the metal complex ink is preferably 1 mPa·s to 100 mPa·s, more preferably 2 mPa·s to 50 mPa·s, and still more preferably 3 mPa·s to 30 mPa·s.

The viscosity of the metal complex ink is a value measured at 25° C. by using a viscometer. The viscosity is measured using, for example, a VISCOMETER TV-22 type viscometer (manufactured by Toki Sangyo Co., Ltd.).

The surface tension of the metal complex ink is not particularly limited, and is preferably 20 mN/m to 45 mN/m and more preferably 25 mN/m to 35 mN/m. The surface tension is a value measured at 25° C. by using a surface tension meter.

The surface tension of the metal complex ink is measured using, for example, DY-700 (manufactured by Kyowa Interface Science Co., Ltd.).

(Metal Salt Ink)

The metal salt ink is, for example, an ink composition obtained by dissolving a metal salt in a solvent.

—Metal Salt—

Examples of metals constituting the metal salt include silver, copper, gold, aluminum, magnesium, tungsten, molybdenum, zinc, nickel, iron, platinum, tin, and lead. Among these, from the viewpoint of the electromagnetic wave-shielding properties, the metal constituting the metal salt preferably includes at least one selected from the group consisting of silver, gold, platinum, nickel, palladium, and copper, and more preferably includes silver.

The content of the metal contained in the metal salt ink is preferably 1% by mass to 40% by mass, more preferably 5% by mass to 30% by mass, and still more preferably 7% by mass to 20% by mass, with respect to the total amount of the metal salt ink, in terms of the metal element.

The content of the metal salt in the metal salt ink is preferably 10% by mass to 90% by mass, and more preferably 10% by mass to 40% by mass, with respect to the total amount of the metal salt ink. In a case in which the content of the metal salt is 10% by mass or more, the surface resistivity is further reduced. In a case in which the content of the metal salt is 90% by mass or less, jettability is improved in a case in which the metal particle ink is applied by using a spray method or an ink jet recording method.

Examples of the metal salt include benzoate, halide, carbonate, citrate, iodate, nitrite, nitrate, acetate, phosphate, sulfate, sulfide, trifluoroacetate, and carboxylate of a metal. Two or more salts may be combined.

From the viewpoint of the electromagnetic wave-shielding properties and storage stability, the metal salt is preferably a metal carboxylate. The carboxylic acid forming the carboxylate is preferably at least one selected from the group consisting of formic acid and a carboxylic acid having 1 to 30 carbon atoms, and more preferably a carboxylic acid having 8 to 20 carbon atoms, and still more preferably a fatty acid having 8 to 20 carbon atoms. The fatty acid may be linear or branched or may have a substituent.

Examples of the linear fatty acid include acetic acid, propionic acid, butyric acid, valeric acid, pentanoic acid, hexanoic acid, heptanoic acid, behenic acid, oleic acid, octanoic acid, nonanoic acid, decanoic acid, caproic acid, enanthic acid, caprylic acid, pelargonic acid, capric acid, and undecanoic acid.

Examples of the branched fatty acid include isobutyric acid, isovaleric acid, ethylhexanoic acid, neodecanoic acid, pivalic acid, 2-methylpentanoic acid, 3-methylpentanoic acid, 4-methylpentanoic acid, 2,2-dimethylbutanoic acid, 2,3-dimethylbutanoic acid, 3,3-dimethylbutanoic acid, and 2-ethylbutanoic acid.

Examples of the carboxylic acid having a substituent include hexafluoroacetylacetonate, hydroangelate, 3-hydroxybutyric acid, 2-methyl-3-hydroxybutyric acid, 3-methoxybutyric acid, acetonedicarboxylic acid, 3-hydroxyglutaric acid, 2-methyl-3-hydroxyglutaric acid, and 2,2,4,4-hydroxyglutaric acid.

The metal salt may be a commercially available product or may be manufactured by a known method. A silver salt is manufactured, for example, by the following method.

First, a silver compound (for example, silver acetate) functioning as a silver supply source and formic acid or a fatty acid having 1 to 30 carbon atoms in the same quantity as the molar equivalent of the silver compound are added to an organic solvent such as ethanol. The mixture is stirred for a predetermined time by using an ultrasonic stirrer, and the formed precipitate is washed with ethanol and decanted. All of these steps can be performed at a room temperature (25° C.). A mixing ratio of the silver compound and the formic acid or fatty acid having 1 to 30 carbon atoms is preferably 1:2 to 2:1, and more preferably 1:1, in terms of molar ratio.

—Solvent—

The metal salt ink preferably contains a solvent.

A type of the solvent is not particularly limited as long as it can dissolve the metal salt contained in the metal salt ink.

From the viewpoint of ease of manufacturing, the boiling point of the solvent is preferably 30° C. to 300° C., more preferably 50° C. to 300° C., and still more preferably 50° C. to 250° C.

The content of the solvent in the metal salt ink is preferably set such that the concentration of metal ions with respect to the metal salt (the amount of the metal present as free ions with respect to 1 g of the metal salt) is 0.01 mmol/g to 3.6 mmol/g, and more preferably set such that the concentration of metal ions is 0.05 mmol/g to 2.6 mmol/g. In a case in which the concentration of metal ions is within the above range, the metal salt ink has excellent fluidity and can obtain the electromagnetic wave-shielding properties.

Examples of the solvent include a hydrocarbon, a cyclic hydrocarbon, an aromatic hydrocarbon, a carbamate, an alkene, an amide, an ether, an ester, an alcohol, a thiol, a thioether, phosphine, and water.

The metal salt ink may contain only one solvent or two or more solvents.

The solvent preferably contains an aromatic hydrocarbon.

Examples of the aromatic hydrocarbon include benzene, toluene, xylene, ethylbenzene, propylbenzene, isopropylbenzene, butylbenzene, isobutylbenzene, t-butylbenzene, trimethylbenzene, pentylbenzene, hexylbenzene, tetraline, benzyl alcohol, phenol, cresol, methyl benzoate, ethyl benzoate, propyl benzoate, and butyl benzoate.

From the viewpoint of compatibility with other components, the number of aromatic rings in the aromatic hydrocarbon is preferably 1 or 2, and more preferably 1.

From the viewpoint of ease of manufacturing, a boiling point of the aromatic hydrocarbon is preferably 50° ° C. to 300° C., more preferably 60° C. to 250° C., and still more preferably 80° C. to 200° C.

The solvent may contain an aromatic hydrocarbon and a hydrocarbon other than the aromatic hydrocarbon.

Examples of the hydrocarbon other than the aromatic hydrocarbon include a linear hydrocarbon having 6 to 20 carbon atoms, a branched hydrocarbon having 6 to 20 carbon atoms, and an alicyclic hydrocarbon having 6 to 20 carbon atoms.

Examples of the hydrocarbon other than the aromatic hydrocarbon include pentane, hexane, heptane, octane, nonane, decane, undecane, dodecane, tridecane, tetradecane, pentadecane, hexadecane, octadecane, nonadecane, decalin, cyclohexane, cycloheptane, cyclooctane, cyclononane, cyclodecane, decene, a terpene-based compound, and icosane.

The hydrocarbon other than the aromatic hydrocarbon preferably contains an unsaturated bond.

Examples of the hydrocarbon containing an unsaturated bond other than the aromatic hydrocarbon include a terpene-based compound.

Depending on the number of isoprene units constituting the terpene-based compound, the terpene-based compound is classified into, for example, a hemiterpene, a monoterpene, a sesquiterpene, a diterpene, a sesterterpene, a triterpene, a sesquarterpene, and a tetraterpene.

The terpene-based compound as the solvent may be any of the above compounds, but is preferably a monoterpene.

Examples of the monoterpene include pinene (α-pinene and β-pinene), terpineol (α-terpineol, β-terpineol, and γ-terpineol), myrcene, camphene, limonene (d-limonene, l-limonene, and dipentene), ocimene (α-ocimene and β-ocimene), alloocimene, phellandrene (α-phellandrene and β-phellandrene), terpinene (α-terpinene and γ-terpinene), terpinolene (α-terpinolene, β-terpinolene, γ-terpinolene, and δ-terpinolene), 1,8-cineole, 1,4-cineole, sabinene, paramenthadiene, and carene (δ-3-carene).

As the monoterpene, a cyclic monoterpene is preferable, and pinene, terpineol, or carene is more preferable.

The ether may be any of a linear ether, a branched ether, or a cyclic ether. Examples of the ether include diethyl ether, dipropyl ether, dibutyl ether, methyl-t-butyl ether, tetrahydrofuran, tetrahydropyrane, dihydropyrane, and 1,4-dioxane.

The alcohol may be any of a primary alcohol, a secondary alcohol, or a tertiary alcohol.

Examples of the alcohol include ethanol, 1-propanol, 2-propanol, 1-methoxy-2-propanol, 1-butanol, 2-butanol, 1-pentanol, 2-pentanol, 3-pentanol, 1-hexanol, 2-hexanol, 3-hexanol, 1-octanol, 2-octanol, 3-octanol, tetrahydrofurfuryl alcohol, cyclopentanol, terpineol, decanol, isodecyl alcohol, lauryl alcohol, isolauryl alcohol, myristyl alcohol, isomyristyl alcohol, cetyl alcohol (cetanol), isocetyl alcohol, stearyl alcohol, isostearyl alcohol, oleyl alcohol, isooleyl alcohol, linoleyl alcohol, isolinoleyl alcohol, palmityl alcohol, isopalmityl alcohol, icosyl alcohol, and isoicosyl alcohol.

Examples of the ketone include acetone, methyl ethyl ketone, methyl isobutyl ketone, and cyclohexanone.

Examples of the ester include methyl acetate, ethyl acetate, isopropyl acetate, butyl acetate, isobutyl acetate, sec-butyl acetate, methoxybutyl acetate, ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, propylene glycol monomethyl ether acetate, propylene glycol monoethyl ether acetate, propylene glycol monobutyl ether acetate, dipropylene glycol monomethyl ether acetate, dipropylene glycol monoethyl ether acetate, dipropylene glycol monobutyl ether acetate, and 3-methoxybutyl acetate.

The viscosity of the metal salt ink is not particularly limited. The viscosity of the metal salt ink need only be 0.01 Pa·s to 5000 Pa·s, and is preferably 0.1 Pa·s to 100 Pa·s. In a case in which the metal salt ink is applied by using a spray method or an ink jet recording method, the viscosity of the metal salt ink is preferably 1 mPa·s to 100 mPa·s, more preferably 2 mPa·s to 50 mPa·s, and still more preferably 3 mPa·s to 30 mPa·s.

The viscosity of the metal salt ink is a value measured at 25° C. by using a viscometer. The viscosity is measured using, for example, a VISCOMETER TV-22 type viscometer (manufactured by Toki Sangyo Co., Ltd.).

The surface tension of the metal salt ink is not particularly limited, and is preferably 20 mN/m to 45 mN/m and more preferably 25 mN/m to 35 mN/m. The surface tension is a value measured at 25° C. by using a surface tension meter.

The surface tension of the metal salt ink is measured using, for example, DY-700 (manufactured by Kyowa Interface Science Co., Ltd.).

The ink for forming an electromagnetic wave shielding layer preferably contains a metal complex or a metal salt.

The metal complex preferably has a structure derived from at least one selected from the group consisting of an ammonium carbamate-based compound, an ammonium carbonate-based compound, an amine, and a carboxylic acid having 8 to 20 carbon atoms.

The metal salt is preferably a metal carboxylate.

<Method for Forming Electromagnetic Wave Shielding Layer>

In the second step, the electromagnetic wave shielding layer is preferably formed by applying the ink for forming an electromagnetic wave shielding layer into the ground region on the electronic substrate and solidifying the applied ink for forming an electromagnetic wave shielding layer through heating (for example, baking described below) and/or ultraviolet irradiation.

(Application Method of Ink for Forming Electromagnetic Wave Shielding Layer)

As the application method of the ink for forming an electromagnetic wave shielding layer, an ink jet recording method, a dispenser method, or a spray method is preferable, and the ink jet recording method is particularly preferable.

The ink jet recording method may be any of an electric charge control method of jetting an ink by using electrostatic attraction force, a drop-on-demand method (pressure pulse method) using a vibration pressure of a piezo element, an acoustic ink jet method of jetting an ink by using a radiation pressure by means of converting electric signals into acoustic beams and irradiating the ink with the acoustic beams, or a thermal ink jet (Bubble Jet (registered trademark)) method of forming air bubbles by heating an ink and using the generated pressure.

As the ink jet recording method, particularly, an ink jet recording method, disclosed in JP1979-59936A (JP-S54-59936A), of jetting an ink from a nozzle using an action force caused by a rapid change in volume of the ink after being subjected to an action of thermal energy can be effectively used.

Regarding the ink jet recording method, the method disclosed in paragraphs 0093 to 0105 of JP2003-306623 A can also be referred to.

Examples of ink jet heads used in the ink jet recording method include ink jet heads for a shuttle method of performing recording while scanning the heads in a width direction of the substrate using short serial heads and a line method using line heads each of which is formed of recording elements arranged for the entire region of one side of the substrate.

In the line method, by scanning the substrate to be scanned in a direction intersecting with the arrangement direction of the recording elements, a pattern can be formed on the entire surface of the substrate. Therefore, this method does not require a transport system such as a carriage that moves short heads for scanning.

In addition, complicated scanning control between the carriage movement and the substrate is not necessary, and only the substrate moves. Therefore, higher recording speeds can be realized compared to the shuttle method.

The amount of droplets of the insulating ink jetted from the ink jet head is preferably 1 μL (picoliter) to 100 μL, more preferably 3 μL to 80 μL, and still more preferably 3 μL to 20 μL.

A temperature of the electronic substrate in a case of applying the ink for forming an electromagnetic wave shielding layer is preferably 20° C. to 120° C., and more preferably 28° C. to 80° C.

From the viewpoint of the electromagnetic wave-shielding properties, the thickness of the whole electromagnetic wave shielding layer is preferably 0.1 μm to 30 μm, and more preferably 0.3 μm to 15 μm.

The thickness of the whole electromagnetic wave shielding layer is measured using a laser microscope (trade name "VK-X1000" manufactured by KEYENCE CORPORATION.).

An average thickness per electromagnetic wave shielding layer is obtained by dividing the thickness of the entire electromagnetic wave shielding layer by the number of times of the formation of the electromagnetic wave shielding layer (that is, the number of times of the application of the ink for forming an electromagnetic wave shielding layer).

In the second step, the average thickness per electromagnetic wave shielding layer is preferably 1.5 μm or less, and more preferably 1.2 μm or less.

In a case in which the average thickness per electromagnetic wave shielding layer is 1.5 μm or less, the electromagnetic wave-shielding properties are further improved.

(Baking Step)

The second step may include a baking step of baking the ink for forming an electromagnetic wave shielding layer applied onto the electronic substrate to solidify the ink for forming an electromagnetic wave shielding layer to form an electromagnetic wave shielding layer.

A baking temperature is preferably 250° C. or lower, more preferably 50° C. to 200° ° C., and still more preferably 60° C. to 180° C.

In addition, a baking time is preferably 1 minute to 120 minutes, and more preferably 1 minute to 40 minutes.

In a case in which the baking temperature and the baking time are in the above ranges, it is possible to reduce an influence of substrate deformation or the like caused by heat.

<Ink for Forming Insulating Protective Layer>

In the present disclosure, the insulating protective layer is preferably a solidified product of the ink for forming an insulating protective layer.

That is, the insulating protective layer in the present disclosure is preferably formed by applying the ink for forming an insulating protective layer and solidifying the ink for forming an insulating protective layer.

In addition, as described above, as with the insulating protective layer, the insulating partition wall is preferably a solidified product of the ink for forming an insulating protective layer.

The ink for forming an insulating protective layer is preferably an active energy ray curable-type ink.

The ink for forming an insulating protective layer, which is the active energy ray curable-type ink, contains a polymerizable monomer and a polymerization initiator.

(Polymerizable Monomer)

The polymerizable monomer refers to a monomer having at least one polymerizable group in one molecule. The polymerizable group in the polymerizable monomer may be a cationically polymerizable group or a radically polymerizable group. From the viewpoint of curing properties, the polymerizable group is preferably a radically polymerizable group. In addition, from the viewpoint of curing properties, the radically polymerizable group is preferably an ethylenically unsaturated group.

In the present disclosure, the monomer refers to a compound having a molecular weight of 1000 or less. The molecular weight can be calculated from the type and number of atoms constituting the compound.

The polymerizable monomer may be a monofunctional polymerizable monomer having one polymerizable group or a polyfunctional polymerizable monomer having two or more polymerizable groups.

The monofunctional polymerizable monomer is not particularly limited as long as it is a monomer having one polymerizable group.

From the viewpoint of curing properties, the monofunctional polymerizable monomer is preferably a monofunctional radically polymerizable monomer, and more preferably a monofunctional ethylenically unsaturated monomer.

Examples of the monofunctional ethylenically unsaturated monomer include monofunctional (meth)acrylate, monofunctional (meth)acrylamide, a monofunctional aromatic vinyl compound, monofunctional vinyl ether, and a monofunctional N-vinyl compound.

In the present disclosure, the insulating protective layer is preferably a solidified product of the ink for forming an insulating protective layer.

That is, the insulating protective layer in the present disclosure is preferably formed by applying the ink for forming an insulating protective layer and solidifying the ink for forming an insulating protective layer.

The ink for forming an insulating protective layer is preferably an active energy ray curable-type ink.

The ink for forming an insulating protective layer, which is the active energy ray curable-type ink, contains a polymerizable monomer and a polymerization initiator.

(Polymerizable Monomer)

The polymerizable monomer refers to a monomer having at least one polymerizable group in one molecule. The polymerizable group in the polymerizable monomer may be a cationically polymerizable group or a radically polymerizable group. From the viewpoint of curing properties, the polymerizable group is preferably a radically polymerizable group. In addition, from the viewpoint of curing properties, the radically polymerizable group is preferably an ethylenically unsaturated group.

In the present disclosure, the monomer refers to a compound having a molecular weight of 1000 or less. The molecular weight can be calculated from the type and number of atoms constituting the compound.

The polymerizable monomer may be a monofunctional polymerizable monomer having one polymerizable group or a polyfunctional polymerizable monomer having two or more polymerizable groups.

The monofunctional polymerizable monomer is not particularly limited as long as it is a monomer having one polymerizable group. From the viewpoint of curing properties, the monofunctional polymerizable monomer is preferably a monofunctional radically polymerizable monomer, and more preferably a monofunctional ethylenically unsaturated monomer.

Examples of the monofunctional ethylenically unsaturated monomer include monofunctional (meth)acrylate, monofunctional (meth)acrylamide, a monofunctional aromatic vinyl compound, monofunctional vinyl ether, and a monofunctional N-vinyl compound.

Examples of the monofunctional (meth)acrylate include methyl (meth)acrylate, ethyl (meth)acrylate, propyl (meth)acrylate, n-butyl (meth)acrylate, hexyl (meth)acrylate, 2-ethylhexyl (meth)acrylate, tert-octyl (meth)acrylate, isoamyl (meth)acrylate, decyl (meth)acrylate, isodecyl (meth)acrylate, lauryl (meth)acrylate, stearyl (meth)acrylate, isostearyl (meth)acrylate, cyclohexyl (meth)acrylate, 4-n-butylcyclohexyl (meth)acrylate, 4-tert-butylcyclohexyl (meth)acrylate, bornyl (meth)acrylate, isobornyl (meth)acrylate, 2-ethylhexyldiglycol (meth)acrylate, butoxyethyl (meth)acrylate, 2-chloroethyl (meth)acrylate, 4-bromobutyl (meth)acrylate, cyanoethyl (meth)acrylate, benzyl (meth)acrylate, butoxymethyl (meth)acrylate, 3-methoxybutyl (meth)acrylate, 2-(2-methoxyethoxy)ethyl (meth)acrylate, 2-(2-butoxyethoxy)ethyl (meth)acrylate, 2,2,2-tetrafluoroethyl (meth)acrylate, 1H,1H,2H,2H-perfluorodecyl (meth)acrylate, 4-butylphenyl (meth)acrylate, phenyl (meth)acrylate, 2,4,5-tetramethylphenyl (meth)acrylate, 4-chlorophenyl (meth)acrylate, 2-phenoxymethyl (meth)acrylate, 2-phenoxyethyl (meth)acrylate, glycidyl (meth)acrylate, glycidyloxybutyl (meth)acrylate, glycidyloxyethyl (meth)acrylate, glycidyloxypropyl (meth)acrylate, tetrahydrofurfuryl (meth)acrylate, 2-hydroxyethyl (meth)acrylate, 3-hydroxypropyl (meth)acrylate, 2-hydroxypropyl (meth)acrylate, 2-hydroxybutyl (meth)acrylate, 3-hydroxybutyl (meth)acrylate, 4-hydroxybutyl (meth)acrylate, cyclic trimethylolpropane formal (meth)acrylate, phenylglycidyl ether (meth)acrylate, dimethylaminoethyl (meth)acrylate, diethylaminoethyl (meth)acrylate, dimethylaminopropyl (meth)acrylate, diethylaminopropyl (meth)acrylate, trimethoxysilylpropyl (meth)acrylate, trimethylsilylpropyl (meth)acrylate, polyethylene oxide monomethyl ether (meth)acrylate, polyethylene oxide (meth)acrylate, polyethylene oxide monoalkyl ether (meth)acrylate, dipropylene glycol (meth)acrylate, polypropylene oxide monoalkyl ether (meth)acrylate, 2-methacryloyloxyethyl succinate, 2-methacryloyloxyhexahydrophthalic acid, 2-methacryloyloxyethyl-2-hydroxypropyl phthalate, ethoxydiethylene glycol (meth)acrylate, butoxydiethylene glycol (meth)acrylate, trifluoroethyl (meth)acrylate, perfluorooctylethyl (meth)acrylate, 2-hydroxy-3-phenoxypropyl (meth)acrylate, ethylene oxide (EO)-modified phenol (meth)acrylate, EO-modified cresol (meth)acrylate, EO-modified nonylphenol (meth)acrylate, propylene oxide (PO)-modified nonylphenol (meth)acrylate, EO-modified-2-ethylhexyl (meth)acrylate, dicyclopentenyl (meth)acrylate, dicyclopentenyloxyethyl (meth)acrylate, dicyclopentanyl (meth)acrylate, (3-ethyl-3-oxetanylmethyl) (meth)acrylate, phenoxyethylene glycol (meth)acrylate, 2-carboxyethyl (meth)acrylate, and 2-(meth)acryloyloxyethyl succinate.

Among these, from the viewpoint of improving heat resistance, the monofunctional (meth)acrylate is preferably a monofunctional (meth)acrylate having an aromatic ring or an aliphatic ring, and is more preferably isobornyl (meth)acrylate, 4-tert-butylcyclohexyl (meth)acrylate, dicyclopentenyl (meth)acrylate, or dicyclopentanyl (meth)acrylate.

Examples of the monofunctional (meth)acrylamide include (meth)acrylamide, N-methyl (meth)acrylamide, N-ethyl (meth)acrylamide, N-propyl (meth)acrylamide, N-n-butyl (meth)acrylamide, N-t-butyl (meth)acrylamide, N-butoxymethyl (meth)acrylamide, N-isopropyl (meth)

acrylamide, N-methylol (meth)acrylamide, N,N-dimethyl (meth)acrylamide, N,N-diethyl (meth)acrylamide, and (meth)acryloylmorpholine.

Examples of the monofunctional aromatic vinyl compound include styrene, dimethylstyrene, trimethylstyrene, isopropylstyrene, chloromethylstyrene, methoxystyrene, acetoxystyrene, chlorostyrene, dichlorostyrene, bromostyrene, vinyl benzoic acid methyl ester, 3-methylstyrene, 4-methylstyrene, 3-ethylstyrene, 4-ethylstyrene, 3-propylstyrene, 4-propylstyrene, 3-butylstyrene, 4-butylstyrene, 3-hexylstyrene, 4-hexylstyrene, 3-octylstyrene, 4-octylstyrene, 3-(2-ethylhexyl)styrene, 4-(2-ethylhexyl)styrene, allyl styrene, isopropenyl styrene, butenyl styrene, octenyl styrene, 4-t-butoxycarbonyl styrene, and 4-t-butoxystyrene.

Examples of the monofunctional vinyl ether include methyl vinyl ether, ethyl vinyl ether, propyl vinyl ether, n-butyl vinyl ether, t-butyl vinyl ether, 2-ethylhexyl vinyl ether, n-nonyl vinyl ether, lauryl vinyl ether, cyclohexyl vinyl ether, cyclohexyl methyl vinyl ether, 4-methylcyclohexyl methyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxypolyethylene glycol vinyl ether, tetrahydrofurfuryl vinyl ether, 2-hydroxyethyl vinyl ether, 2-hydroxypropyl vinyl ether, 4-hydroxybutyl vinyl 4-ether, hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, and phenoxypolyethylene glycol vinyl ether.

Examples of the monofunctional N-vinyl compound include N-vinyl-8-caprolactam and N-vinylpyrrolidone.

The polyfunctional polymerizable monomer is not particularly limited as long as it is a monomer having two or more polymerizable groups. From the viewpoint of curing properties, the polyfunctional polymerizable monomer is preferably a polyfunctional radically polymerizable monomer, and more preferably a polyfunctional ethylenically unsaturated monomer.

Examples of the polyfunctional ethylenically unsaturated monomer include a polyfunctional (meth)acrylate compound and a polyfunctional vinyl ether.

Examples of the polyfunctional (meth)acrylate include ethylene glycol di(meth)acrylate, diethylene glycol di(meth)acrylate, triethylene glycol di(meth)acrylate, polyethylene glycol di(meth)acrylate, propylene glycol di(meth)acrylate, dipropylene glycol di(meth)acrylate, tripropylene glycol di(meth)acrylate, polypropylene glycol di(meth)acrylate, butylene glycol di(meth)acrylate, tetraethylene glycol di(meth)acrylate, neopentyl glycol di(meth)acrylate, 3-methyl-1,5-pentanediol di(meth)acrylate, 1,4-butanediol di(meth)acrylate, 1,6-hexanediol di(meth)acrylate, heptanediol di(meth)acrylate, EO-modified neopentyl glycol di(meth)acrylate, PO-modified neopentyl glycol di(meth)acrylate, EO-modified hexanediol di(meth)acrylate, PO-modified hexanediol di(meth)acrylate, octanediol di(meth)acrylate, nonanediol di(meth)acrylate, decanediol di(meth)acrylate, dodecanediol di(meth)acrylate, glycerin di(meth)acrylate, pentaerythritol di(meth)acrylate, ethylene glycol diglycidyl ether di(meth)acrylate, diethylene glycol diglycidyl ether di(meth)acrylate, tricyclodecanedimethanol di(meth)acrylate, trimethylolethane tri(meth)acrylate, trimethylolpropane tri(meth)acrylate, trimethylolpropane EO-added tri(meth) acrylate, pentaerythritol tri(meth)acrylate, pentaerythritol tetra(meth)acrylate, dipentaerythritol tetra(meth)acrylate, dipentaerythritol penta(meth)acrylate, dipentaerythritol hexa(meth)acrylate, tri(meth)acryloyloxyethoxytrimethylolpropane, glycerin polyglycidyl ether poly(meth)acrylate, and tris(2-acryloyloxyethyl) isocyanurate.

Examples of the polyfunctional vinyl ether include 1,4-butanediol divinyl ether, ethylene glycol divinyl ether, diethylene glycol divinyl ether, triethylene glycol divinyl ether, polyethylene glycol divinyl ether, propylene glycol divinyl ether, butylene glycol divinyl ether, hexanediol divinyl ether, 1,4-cyclohexanedimethanol divinyl ether, bisphenol A alkylene oxide divinyl ether, bisphenol F alkylene oxide divinyl ether, trimethylolethane trivinyl ether, trimethylolpropane trivinyl ether, ditrimethylolpropane tetravinyl ether, glycerin trivinyl ether, pentaerythritol tetravinyl ether, dipentaerythritol pentavinyl ether, dipentaerythritol hexavinyl ether, EO-added trimethylolpropane trivinyl ether, PO-added trimethylolpropane trivinyl ether, EO-added ditrimethylolpropane tetravinyl ether, PO-added ditrimethylolpropane tetravinyl ether, EO-added pentaerythritol tetravinyl ether, PO-added pentaerythritol tetravinyl ether, EO-added dipentaerythritol hexavinyl ether, and PO-added dipentaerythritol hexavinyl ether.

Among these, from the viewpoint of curing properties, the polyfunctional polymerizable monomer is preferably a monomer having 3 to 11 carbon atoms in a portion other than a (meth)acryloyl group. As the monomer having 3 to 11 carbon atoms in a portion other than a (meth)acryloyl group, specifically, 1,6-hexanediol di(meth)acrylate, dipropylene glycol di(meth)acrylate, PO-modified neopentyl glycol di(meth)acrylate, 1,4-butanediol di(meth)acrylate, 3-methyl-1,5-pentanediol di(meth)acrylate, polyethylene glycol di(meth)acrylate (EO chain n=4), or 1,10-decanediol di(meth)acrylate is more preferable.

The content of the polymerizable monomer is preferably 10% by mass to 98% by mass, and more preferably 50% by mass to 98% by mass, with respect to the total amount of the ink for forming an insulating protective layer.

(Polymerization Initiator)

Examples of the polymerization initiator contained in the ink for forming an insulating protective layer include an oxime compound, an alkylphenone compound, an acylphosphine compound, an aromatic onium salt compound, an organic peroxide, a thio compound, a hexaarylbisimidazole compound, a borate compound, an azinium compound, a titanocene compound, an active ester compound, a carbon halogen bond-containing compound, and an alkylamine.

Among these, from the viewpoint of further improving conductivity, the polymerization initiator contained in the ink for forming an insulating layer is preferably at least one selected from the group consisting of an oxime compound, an alkylphenone compound, and a titanocene compound, more preferably an alkylphenone compound, and still more preferably at least one selected from the group consisting of an α-aminoalkylphenone compound, a benzyl ketal, and an alkylphenone.

The content of the polymerization initiator is preferably 0.5% by mass to 20% by mass, and more preferably 2% by mass to 10% by mass, with respect to the total amount of the ink for forming an insulating layer.

The ink for forming an insulating protective layer may contain other components different from the polymerization initiator and the polymerizable monomer. Examples of the other components include a chain transfer agent, a polymerization inhibitor, a sensitizer, a surfactant, and an additive.

(Chain Transfer Agent)

The ink for forming an insulating protective layer may contain at least one chain transfer agent.

From the viewpoint of improving reactivity of photopolymerization reaction, the chain transfer agent is preferably a polyfunctional thiol.

Examples of the polyfunctional thiol include aliphatic thiols such as hexane-1,6-dithiol, decane-1,10-dithiol, dimercaptodiethyl ether, and dimercaptodiethyl sulfide, aromatic thiols such as xylylene dimercaptan, 4,4'-dimercaptodiphenylsulfide, and 1,4-benzenedithiol; poly(mercaptoacetate) of a polyhydric alcohol such as ethylene glycol bis(mercaptoacetate), polyethylene glycol bis(mercaptoacetate), propylene glycol bis(mercaptoacetate), glycerin tris(mercaptoacetate), trimethylolethane tris(mercaptoacetate), trimethylolpropane tris(mercaptoacetate), pentaerythritol tetrakis(mercaptoacetate), and dipentaerythritol hexakis(mercaptoacetate); poly(3-mercaptopropionate) of a polyhydric alcohol such as ethylene glycol bis(3-mercaptopropionate), polyethylene glycol bis(3-mercaptopropionate), propylene glycol bis(3-mercaptopropionate), glycerin tris(3-mercaptopropionate), trimethylolethane tris(mercaptopropionate), trimethylolpropane tris(3-mercaptopropionate), pentaerythritol tetrakis(3-mercaptopropionate), and dipentaerythritol hexakis(3-mercaptopropionate); and poly(mercaptobutyrate) such as 1,4-bis(3-mercaptobutyryloxy)butane, 1,3,5-tris(3-mercaptobutyloxyethyl)-1,3,5-triazine-2,4,6(1H,3H,5H)-trione, and pentaerythritol tetrakis(3-mercaptobutyrate).

(Polymerization Inhibitor)

The ink for forming an insulating protective layer may contain at least one polymerization inhibitor.

Examples of the polymerization inhibitor include p-methoxyphenol, quinones (for example, hydroquinone, benzoquinone, and methoxybenzoquinone), phenothiazine, catechols, alkylphenols (for example, dibutyl hydroxy toluene (BHT)), alkyl bisphenols, zinc dimethyldithiocarbamate, copper dimethyldithiocarbamate, copper dibutyldithiocarbamate, copper salicylate, thiodipropionic acid esters, mercaptobenzimidazole, phosphites, 2,2,6,6-tetramethylpiperidine-1-oxyl (TEMPO), 2,2,6,6-tetramethyl-4-hydroxypiperidine-1-oxyl (TEMPOL), and tris(N-nitroso-N-phenylhydroxylamine)aluminum salt (also known as Cupferron Al).

Among these, as the polymerization inhibitor, at least one selected from p-methoxyphenol, catechols, quinones, alkylphenols, TEMPO, TEMPOL, and tris(N-nitroso-N-phenylhydroxylamine)aluminum salt is preferable, and at least one selected from p-methoxyphenol, hydroquinone, benzoquinone, BHT, TEMPO, TEMPOL, and tris(N-nitroso-N-phenylhydroxylamine)aluminum salt is more preferable.

In a case in which the ink for forming an insulating protective layer contains a polymerization inhibitor, the content of the polymerization inhibitor is preferably 0.01% by mass to 2.0% by mass, more preferably 0.02% by mass to 1.0% by mass, and particularly preferably 0.03% by mass to 0.5% by mass, with respect to the total amount of the ink for forming an insulating protective layer.

(Sensitizer)

The ink for forming an insulating protective layer may contain at least one sensitizer.

Examples of the sensitizer include a polynuclear aromatic compound (for example, pyrene, perylene, triphenylene, and 2-ethyl-9,10-dimethoxyanthracene), a xanthene-based compound (for example, fluorescein, eosin, erythrosin, rhodamine B, and rose bengal), a cyanine-based compound (for example, thiacarbocyanine and oxacarbocyanine), a merocyanine-based compound (for example, merocyanine and carbomerocyanine), a thiazine-based compound (for example, thionine, methylene blue, and toluidine blue), an acridine-based compound (for example, acridine orange, chloroflavine, and acryflavine), anthraquinones (for example, anthraquinone), a squarylium-based compound (for example, squarylium), a coumarin-based compound (for example, 7-diethylamino-4-methylcoumarin), a thioxanthone-based compound (for example, isopropylthioxanthone), and a thiochromanone-based compound (for example, thiochromanone). Among these, the sensitizer is preferably a thioxanthone-based compound.

In a case in which the ink for forming an insulating protective layer contains a sensitizer, the content of the sensitizer is not particularly limited, but is preferably 1.0% by mass to 15.0% by mass, and more preferably 1.5% by mass to 5.0% by mass, with respect to the total amount of the ink for forming an insulating protective layer.

(Surfactant)

The ink for forming an insulating protective layer may contain at least one surfactant.

Examples of the surfactant include surfactants disclosed in JP1987-173463A (JP-S62-173463A) and JP1987-183457A (JP-S62-183457A). In addition, examples of the surfactant include anionic surfactants such as dialkyl sulfosuccinate, alkyl naphthalene sulfonate, and a fatty acid salt; nonionic surfactants such as polyoxyethylene alkyl ether, polyoxyethylene alkyl allyl ether, acetylene glycol, and a polyoxyethylene-polyoxypropylene block copolymer; and cationic surfactants such as an alkylamine salt and a quaternary ammonium salt. In addition, the surfactant may be a fluorine-based surfactant or a silicone-based surfactant.

In a case in which the ink for forming an insulating protective layer contains a surfactant, the content of the surfactant is preferably 0.5% by mass or less, and more preferably 0.1% by mass or less, with respect to the total amount of the ink for forming an insulating protective layer. A lower limit of the content of the surfactant is not particularly limited.

In a case in which the content of the surfactant is 0.5% by mass or less, the ink for forming an insulating protective layer is difficult to spread after being applied. Therefore, an outflow of the ink for forming an insulating protective layer is suppressed, thus improving the electromagnetic wave-shielding properties.

(Organic Solvent)

The ink for forming an insulating protective layer may contain at least one organic solvent.

Examples of the organic solvent include (poly)alkylene glycol monoalkyl ethers such as ethylene glycol monoethyl ether, diethylene glycol monoethyl ether, triethylene glycol monomethyl ether, propylene glycol monomethyl ether (PGME), dipropylene glycol monomethyl ether, and tripropylene glycol monomethyl ether; (poly)alkylene glycol dialkyl ethers such as ethylene glycol dibutyl ether, diethylene glycol dimethyl ether, diethylene glycol diethyl ether, dipropylene glycol diethyl ether, and tetraethylene glycol dimethyl ether; (poly)alkylene glycol acetates such as diethylene glycol acetate; (poly)alkylene glycol diacetates such as ethylene glycol diacetate and propylene glycol diacetate; (poly)alkylene glycol monoalkyl ether acetates such as ethylene glycol monobutyl ether acetate and propylene glycol monomethyl ether acetate, ketones such as methyl ethyl ketone and cyclohexanone; lactones such as γ-butyrolactone; esters such as ethyl acetate, propyl acetate, butyl acetate, 3-methoxybutyl acetate (MBA), methyl propionate, and ethyl propionate; cyclic ethers such as tetrahydrofuran and dioxane; and amides such as dimethylformamide and dimethylacetamide.

In a case in which the ink for forming an insulating protective layer contains an organic solvent, the content of the organic solvent is preferably 70% by mass or less, and more preferably 50% by mass or less, with respect to the total amount of the ink for forming an insulating protective layer. A lower limit of the content of the organic solvent is not particularly limited.

(Additive)

As necessary, the ink for forming an insulating protective layer may contain an additive such as a co-sensitizer, an ultraviolet absorber, an antioxidant, an antifading agent, and a basic compound.

(Physical Properties)

From the viewpoint of improving jetting stability in a case in which the ink for forming an insulating protective layer is applied by using an ink jet recording method, a pH of the ink for forming an insulating protective layer is preferably 7 to 10, and more preferably 7.5 to 9.5. The pH is measured at 25° C. using a pH meter, such as a pH meter (model number "HM-31") manufactured by DKK-Toa Corporation.

The viscosity of the ink for forming an insulating protective layer is preferably 0.5 mPa·s to 60 mPa·s, and more preferably 2 mPa·s to 40 mPa·s. The viscosity is measured at 25° C. using a viscometer, such as a TV-22 type viscometer manufactured by Toki Sangyo Co., Ltd.

The surface tension of the ink for forming an insulating protective layer is preferably 60 mN/m or less, more preferably 20 mN/m to 50 mN/m, and still more preferably 25 mN/m to 45 mN/m. The surface tension is measured at 25° C. using a surface tension meter, for example, by a plate method using an automatic surface tension meter (trade name, "CBVP-Z") manufactured by Kyowa Interface Science Co., Ltd.

<Method for Forming Insulating Protective Layer>

In the first step, it is preferable that the ink for forming an insulating protective layer is applied onto an electronic substrate by using an ink jet recording method, a dispenser coating method, or a spray coating method and the ink for forming an insulating protective layer is cured, to form an insulating protective layer.

From the viewpoint of making it possible to form a thin ink film by applying once a small amount of droplets by means of jetting, it is preferable that the ink for forming an insulating protective layer is applied by an ink jet recording method. Details of the ink jet recording method are as described above.

A method of curing the ink for forming an insulating protective layer is not particularly limited, and examples thereof include a method of irradiating the ink for forming an insulating protective layer applied onto the substrate with an active energy ray.

Examples of the active energy ray include ultraviolet rays, visible rays, and electron beams. Among these, ultraviolet rays (hereinafter, also referred to as "UV") are preferable.

A peak wavelength of the ultraviolet rays is preferably 200 nm to 405 nm, more preferably 250 nm to 400 nm, and still more preferably 300 nm to 400 nm.

An exposure amount during the irradiation with an active energy ray is preferably 100 mJ/cm$^2$ to 5000 mJ/cm$^2$, and more preferably 300 mJ/cm$^2$ to 1500 mJ/cm$^2$.

As a light source for ultraviolet irradiation, a mercury lamp, a gas laser, and a solid-state laser are mainly used, and a mercury lamp, a metal halide lamp, and an ultraviolet fluorescent lamp are widely known. In addition, a light emitting diode (UV-LED) and a laser diode (UV-LD) are compact, long-life, highly efficient, and low-cost, and are expected to be used as the light source for ultraviolet irradiation. Among these, the light source for ultraviolet irradiation is preferably a metal halide lamp, a high-pressure mercury lamp, a medium-pressure mercury lamp, a low-pressure mercury lamp, or UV-LED.

In the step of obtaining the insulating protective layer, in order to obtain an insulating protective layer having a desired thickness, the step of applying the insulating ink and irradiating the insulating ink with an active energy ray is preferably repeated two or more times.

A thickness of the insulating protective layer is preferably 5 μm to 5000 μm, and more preferably 10 μm to 2000 μm.

EXAMPLES

Hereinafter, examples of the present disclosure will be shown, but the present disclosure is not limited to the following examples.

Example 1

<Manufacture of Electronic Device X1>

(Preparation of Electronic Substrate A1)

A shielding can and a frame were removed from a LTE module manufactured by Quectel, Inc. to obtain an electronic substrate A1.

This electronic substrate A1 is included in the scope of the electronic substrate (that is, the electronic substrate comprising the wiring board having the mounting surface, the plurality of electronic components mounted on the mounting surface of the wiring board, and the ground electrode disposed to surround at least one of the plurality of electronic components in plan view) in the present disclosure.

In the electronic substrate A1, the height (unit: μm) of the electronic component in the ground region and the height (hereinafter, also referred to as "H3"; unit: μm) of the ground electrode are as shown in Table 1.

Both the heights are heights from the mounting surface (surface of the solder resist layer) of the wiring board.

The same applies to the heights of the insulating partition wall and the insulating protective layer, which will be described below.

(Preparation of Ink B1 for Forming Insulating Protective Layer)

The components of the following composition were mixed together, and the mixture was stirred for 20 minutes at 25° ° C. under a condition of 5000 rpm by using a mixer (trade name "L4R" manufactured by Silverson), thereby obtaining an ink B1 for forming an insulating protective layer.

—Composition of Ink B1 for Forming Insulating Protective Layer—

Omni. 379: 2-(dimethylamino)-2-(4-methylbenzyl)-1-(4-morpholinophenyl)-butan-1-one (trade name "Omnirad 379" manufactured by IGM Resins B.V., Inc.) . . . 1.0% by mass 4-PBZ: 4-phenylbenzophenone (trade name "Omnirad 4-PBZ" manufactured by IGM Resins B. V.) . . . 7.5% by mass NVC: N-vinylcaprolactam (manufactured by FUJIFILM Wako Pure Chemical Corporation) . . . 15.0% by mass HDDA: 1,6-hexanediol diacrylate (trade name "SR238" manufactured by Sartomer Japan Inc.) . . . 25.5% by mass IBOA: isobornyl acrylate (trade name "SR506" manufactured by Sartomer Japan Inc.) . . . 30.0% by mass Pentaerythritol tetrakis(3-mercaptobutyrate) trade name "KARENZ MT-PE1" 20.0% by mass MEHQ: p-methoxyphenol (manufactured by FUJIFILM Wako Pure Chemical Corporation) . . . 1.0% by mass (Ink C1 for Forming Electromagnetic Wave Shielding Layer)

40 g of silver neodecanoate was added to a 200 mL three-neck flask. Next, 30.0 g of trimethylbenzene and 30.0 g of terpineol were added thereto and stirred, thereby obtaining a solution containing a silver salt. The obtained solution was filtered using a membrane filter made of polytetrafluoroethylene (PTFE) having a pore diameter of 0.45 µm, thereby obtaining an ink C1 for forming an electromagnetic wave shielding layer.

(Formation of Insulating Protective Layer and Insulating Partition Wall (First Step))

An ink jet recording device (trade name "DMP-2850" manufactured by Fujifilm Dimatix Inc.) was prepared, and an ink cartridge (10 picoliters) of this ink jet recording device was filled with the ink B1 for forming an insulating protective layer.

UV SPOT CURE OmniCure S2000 (manufactured by Lumen Dynamics Group Inc.) was disposed next to the ink jet head of the ink jet recording device.

The ink B1 for forming an insulating protective layer was jetted from the ink jet head in the ink jet recording device and applied to a formation region of the insulating protective layer on the electronic substrate, and the applied ink B1 for forming an insulating protective layer was irradiated with ultraviolet rays (UV) by UV spot curing. By repeating a set of the application of the ink and UV irradiation, an insulating protective layer was formed.

A pattern of the insulating protective layer was set such that it covers the electronic component in the ground region of the electronic substrate A1 and a pattern edge is located inside an inner edge of the ground electrode (for example, see FIG. 2A). A repetition number of a set of the application of the ink and the UV irradiation was adjusted such that the height (hereinafter, also referred to as "H2"; the unit is µm) of the insulating protective layer on the electronic component in the ground region is a value shown in Table 1.

Similarly, the ink B1 for forming an insulating protective layer was jetted from the ink jet head in the ink jet recording device and applied to a formation region of the insulating partition wall on the electronic substrate (note: a pattern of the insulating partition wall will be described below), and the applied ink B1 for forming an insulating protective layer was irradiated with ultraviolet rays (UV) by UV spot curing. By repeating a set of the application of the ink and UV irradiation, an insulating partition wall was formed.

The pattern of the insulating partition wall was a pattern along an outer edge of the ground electrode (for example, see FIG. 2A). A repetition number of a set of the application of the ink and the UV irradiation was adjusted such that the height (hereinafter, also referred to as "H1"; the unit is µm) of the insulating partition wall is a value shown in Table 1.

Application conditions of the ink B1 for forming an insulating protective layer in the formation of the insulating protective layer and the formation of the insulating partition wall were set to conditions in which a resolution is 1270 dots per inch (dpi) and the amount of droplets is 10 picoliters per dot.

(Formation of Electromagnetic Wave Shielding Layer (Second Step))

An ink jet recording device (trade name "DMP-2850" manufactured by Fujifilm Dimatix Inc.) was prepared, and an ink cartridge (10 picoliters) of this ink jet recording device was filled with the ink C1 for forming an electromagnetic wave shielding layer.

Next, the electron substrate on which the insulating protective layer and the insulating partition wall were formed was heated to 60° ° C.

Next, the ink C1 for forming an electromagnetic wave shielding layer was jetted from the ink jet head in the ink jet recording device and applied to a formation region of the electromagnetic wave shielding layer on the electronic substrate heated to 60° C. After a lapse of 10 seconds from a time point at which the last ink droplet was landed on the electronic substrate, the ink C1 for forming an electromagnetic wave shielding layer applied onto the electronic substrate was heated at 120° C. for 20 minutes by using a hot plate.

By repeating A set of the application of the ink C1 for forming an electromagnetic wave shielding layer and the heating by the hot plate four times, an electromagnetic wave shielding layer having a thickness of 1.0 µm was formed.

A pattern of the electromagnetic wave shielding layer was set such that it extends over the insulating protective layer and the ground electrode, covers the insulating protective layer, and is electrically connected to the ground electrode (see FIG. 3A).

In this manner, the insulating protective layer, the insulating partition wall, and the electromagnetic wave shielding layer were formed on the electronic substrate A1 to obtain an electronic device X1.

<Evaluation>

The following evaluations were executed on the electronic device X1.

The results are shown in Table 1.

(Short-Circuit)

100 electronic devices X1 were manufactured, and it was confirmed in each of the 100 electronic devices X1 whether a short-circuit between the electromagnetic wave shielding layer and the conductive member outside the ground region occurs as a defect caused by the outflow of the ink for forming an electromagnetic wave shielding layer.

Based on the confirmed results, the short-circuit was evaluated according to the following standard.

In the following evaluation standard, a case in which the short-circuit was most suppressed is ranked "4".

—Evaluation Standards for Short-Circuit—

4: The number of occurrences of the electronic device X1 with a short-circuit was 0 out of 100.

3: The number of occurrences of the electronic device X1 with a short-circuit was 1 out of 100.

2: The number of occurrences of the electronic device X1 with a short-circuit was 2 to 5 out of 100.

1: The number of occurrences of the electronic device X1 with a short-circuit was 6 or more out of 100.

(Durability of Insulating Partition Wall)

The electronic device X1 was subjected to 100 cycles of a cooling treatment from cooling at −40° C. for 30 minutes to heating at 100° C. for 30 minutes.

An operation of dropping the electronic device X1, which had been subjected to the 100 cycles of the cooling treatment, onto a stainless steel plate from a height of 30 cm was executed five times.

After that, the insulating partition wall in the electronic device X1 was observed with an optical microscope to confirm whether chipping or cracks have occurred in the insulating partition wall.

Based on the confirmed results, the durability of the insulating partition wall was evaluated according to the following standard.

In the following evaluation standard, a case of the best durability of the insulating partition wall is ranked "3".

—Evaluation Standards for Durability of Insulating Partition Wall—
  3: Neither chipping nor cracks occurred in the insulating partition wall.
  2: Cracks occurred in the insulating partition wall, but no chipping occurred.
  1: Chipping and cracks occurred in the insulating partition wall.

(Formation Stability of Electromagnetic Wave Shielding Layer)

In the above-described manufacture of the electronic device X1, the height (height from the mounting surface of the wiring board) of the ink jet head for jetting the ink C1 for forming an electromagnetic wave shielding layer was set to be higher than the height of the highest insulating protective layer by 1 mm, and, in this condition, the ink C1 for forming an electromagnetic wave shielding layer was jetted onto the insulating protective layer to form 50 ink dots. After that, the ink dots were heated at 160° C. for 60 minutes to cure the ink dots, thereby obtaining a dot image.

50 dot images after curing and a periphery thereof were observed with an optical microscope to confirm the presence or absence of satellites (that is, unintended dot-like images) and unintended mist-like images.

Based on the confirmed results, the formation stability of the electromagnetic wave shielding layer was evaluated according to the following standard.

In the following evaluation standard, a case of the best formation stability of the electromagnetic wave shielding layer is ranked "3".

—Evaluation Standard of Formation Stability of Electromagnetic Wave Shielding Layer—
  3: Neither satellites nor unintended mist-like images were not confirmed.
  2: Although satellites smaller than a main droplet (intended dot image) were confirmed, no satellites having a size equal to or larger than that of the main droplet (intended dot image) were confirmed, and no unintended mist-like images were confirmed.
  1: At least either of satellites having a size equal to or larger than that of the main droplet (intended dot image) or unintended mist-like images was confirmed.

Examples 2 to 12

The same operation as in Example 1 was performed, except that at least one of the size (that is, the height and/or the thickness) of the insulating partition wall or the height of the insulating protective layer on the electronic component in the ground region was changed as shown in Table 1.

The results are shown in Table 1.

Comparative Example 1

The same operation as in Example 1 was performed, except that no insulating partition wall was formed.

The results are shown in Table 1.

TABLE 1

| | Insulating partition wall | | | | Height of electronic component in ground region (μm) | Height of insulating protective layer on electronic component in ground region (μm) (H2) | Height of ground electrode (μm) (H3) | Height difference [H2 − H1] | Height difference [H1 − H3] | Short-circuit | Evaluation result | |
|---|---|---|---|---|---|---|---|---|---|---|---|---|
| | Presence or absence | Height (μm) (H1) | Thickness (μm) | Aspect ratio [height/thickness] | | | | | | | Durability of insulating partition wall | Formation stability of electromagnetic wave shielding layer |
| Comparative Example 1 | Absent | — | — | — | 500 | 700 | 15 | 700 | — | 1 | — | 3 |
| Example 1 | Present | 3 | 100 | 0.03 | 500 | 700 | 15 | 697 | −12 | 3 | 3 | 3 |
| Example 2 | Present | 7 | 100 | 0.07 | 500 | 700 | 15 | 693 | −8 | 3 | 3 | 3 |
| Example 3 | Present | 15 | 100 | 0.15 | 500 | 700 | 15 | 685 | 0 | 3 | 3 | 3 |
| Example 4 | Present | 20 | 100 | 0.2 | 500 | 700 | 15 | 680 | 5 | 4 | 3 | 3 |
| Example 5 | Present | 30 | 100 | 0.3 | 500 | 700 | 15 | 670 | 15 | 4 | 3 | 3 |
| Example 6 | Present | 60 | 100 | 0.6 | 500 | 700 | 15 | 640 | 45 | 4 | 3 | 3 |
| Example 7 | Present | 120 | 100 | 1.2 | 500 | 700 | 15 | 580 | 105 | 4 | 3 | 3 |
| Example 8 | Present | 640 | 200 | 3.2 | 500 | 650 | 15 | 10 | 625 | 4 | 3 | 3 |
| Example 9 | Present | 650 | 200 | 3.25 | 500 | 650 | 15 | 0 | 635 | 4 | 3 | 2 |
| Example 10 | Present | 700 | 200 | 3.5 | 500 | 650 | 15 | −50 | 685 | 4 | 3 | 2 |
| Example 11 | Present | 20 | 2200 | 0.009 | 500 | 700 | 15 | 680 | 5 | 4 | 3 | 3 |
| Example 12 | Present | 1100 | 100 | 11 | 500 | 700 | 15 | −400 | 1085 | 4 | 2 | 1 |

As shown in Table 1, in Examples 1 to 12 in which the insulating partition wall was provided along the outer edge of the ground electrode in the electronic component, the short-circuit that is a defect caused by the outflow of the ink for forming an electromagnetic wave shielding layer in a case of forming the electromagnetic wave shielding layer was suppressed compared to Comparative Example 1 in which the insulating partition wall was not provided.

It can be seen from the results of Examples 1 to 12 that, in a case in which the height (H1) of the insulating partition wall is lower than the height (H2) of the insulating protective layer on the electronic component in the ground region (Examples 1 to 8 and 11), the formation stability of the electromagnetic wave shielding layer is further improved.

It can be seen from the results of Examples 1 to 10 that, in a case in which the height (H1) of the insulating partition wall is higher than the height (H3) of the ground electrode (Examples 4 to 12), the short-circuit is further suppressed.

It can be seen from the results of Examples 1 to 12 that, in Examples 1 to 10 and 12 in which the aspect ratio [height/thickness] of the insulating partition wall is 0.01 or more, space-saving properties are more excellent because the thickness of the insulating partition wall can be thin.

In addition, it can be seen that, in Examples 1 to 11 in which the aspect ratio [height/thickness] of the insulating partition wall is 10 or less, the durability of the insulating partition wall is more excellent.

The entire disclosure of Japanese Patent Application No. 2021-124414, filed Jul. 29, 2021, is incorporated into the present specification by reference. In addition, all documents, patent applications, and technical standards described in the present specification are incorporated in the present specification by reference, to the same extent as in the case where each of the documents, patent applications, and technical standards is specifically and individually described.

What is claimed is:

1. An electronic device comprising:
   a wiring board having a mounting surface;
   a plurality of electronic components mounted on the mounting surface of the wiring board;
   a ground electrode disposed to surround at least one electronic component among the plurality of electronic components in plan view;
   an insulating protective layer that is disposed in a ground region surrounded by the ground electrode and covers the at least one electronic component;
   an electromagnetic wave shielding layer that is provided to extend over the insulating protective layer and the ground electrode and that covers the insulating protective layer and is electrically connected to the ground electrode, the electromagnetic wave shielding layer being a solidified product of an ink for forming an electromagnetic wave shielding layer; and
   an insulating partition wall that is provided along an outer edge of the ground electrode,
   wherein the insulating protective layer and the insulating partition wall are a solidified product of an ink for forming an insulating protective layer.

2. The electronic device according to claim 1,
   wherein a height of the insulating partition wall is lower than a height of the insulating protective layer on the at least one electronic component.

3. The electronic device according to claim 1,
   wherein a height of the insulating partition wall is lower than a height of the insulating protective layer on the at least one electronic component by 5 µm or more.

4. The electronic device according to claim 1,
   wherein a height of the insulating partition wall is higher than a height of the ground electrode.

5. The electronic device according to claim 1,
   wherein a height of the insulating partition wall is higher than a height of the ground electrode by 5 µm or more.

6. The electronic device according to claim 1,
   wherein the insulating partition wall has an aspect ratio of 0.01 to 10, which is a ratio of a height to a thickness.

7. A manufacturing method of an electronic device, the method comprising:
   preparing an electronic substrate including a wiring board having a mounting surface, a plurality of electronic components mounted on the mounting surface of the wiring board, and a ground electrode disposed to surround at least one electronic component among the plurality of electronic components in plan view;
   forming an insulating protective layer that covers the at least one electronic component in a ground region surrounded by the ground electrode; and
   forming an electromagnetic wave shielding layer that extends over the insulating protective layer and the ground electrode and that covers the insulating protective layer and is electrically connected to the ground electrode, as a solidified product of an ink for forming an electromagnetic wave shielding layer,
   wherein an insulating partition wall is formed along an outer edge of the ground electrode before the forming an electromagnetic wave shielding layer, and
   in the forming an insulating protective layer, the insulating protective layer and the insulating partition wall are formed by using an ink for forming an insulating protective layer.

8. The manufacturing method of an electronic device according to claim 7,
   wherein, in the forming an insulating protective layer, the ink for forming an insulating protective layer is applied by an ink jet recording method, a dispenser method, or a spray method to form the insulating protective layer and the insulating partition wall.

9. The manufacturing method of an electronic device according to claim 7,
   wherein the ink for forming an insulating protective layer is an active energy ray curable-type ink.

* * * * *